(12) United States Patent
Okatsu et al.

(10) Patent No.: US 6,357,649 B1
(45) Date of Patent: Mar. 19, 2002

(54) METHOD AND APPARATUS FOR AUTOMATICALLY SOLDERING A LEAD WIRE TO A SOLAR BATTERY

(75) Inventors: Toshihide Okatsu, Osaka; Masataka Kondo; Akimine Hayashi, both of Kobe; Eiji Kuribe, Osaka, all of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/532,195

(22) Filed: Mar. 22, 2000

(30) Foreign Application Priority Data

| Sep. 29, 1999 | (JP) | 11-276360 |
| Oct. 14, 1999 | (JP) | 11-292730 |
| Oct. 27, 1999 | (JP) | 11-305533 |
| Nov. 2, 1999 | (JP) | 11-312399 |
| Dec. 16, 1999 | (JP) | 11-357400 |

(51) Int. Cl.[7] .................. B23K 31/00; B23K 31/02; B23K 5/20
(52) U.S. Cl. ............ 228/179.1; 228/180.5; 228/1.1; 228/51
(58) Field of Search ............ 228/179.1, 180.5, 228/1.1, 51, 903, 904

(56) References Cited

U.S. PATENT DOCUMENTS

| 3,648,354 A | * | 3/1972 | Mashino et al. ............ 29/470.1 |
| 3,812,581 A | * | 5/1974 | Larson et al. .................. 29/628 |
| 3,913,630 A | * | 10/1975 | Rubey ........................ 140/123 |
| 3,948,429 A | * | 4/1976 | Davies et al. ............... 228/44.1 |
| 3,972,463 A | * | 8/1976 | Conlon et al. ........... 228/44.1 A |
| 4,096,983 A | * | 6/1978 | Beilein et al. ................ 28/122 |
| 4,415,116 A | * | 11/1983 | Norton ........................ 228/180 |
| 4,507,545 A | * | 3/1985 | Riordan ....................... 219/230 |
| 4,832,246 A | * | 5/1989 | Ono et al. ..................... 228/1.1 |
| 4,898,117 A | * | 2/1990 | Ledermann et al. ......... 118/665 |
| 5,261,590 A | * | 11/1993 | Tsai .............................. 228/41 |
| 5,369,059 A | * | 11/1994 | Eberlein ...................... 437/213 |
| 5,770,300 A | * | 6/1998 | Okamoto et al. ........... 428/209 |
| 6,001,725 A | * | 12/1999 | Evers .......................... 438/617 |

FOREIGN PATENT DOCUMENTS

| JP | 07-204838 | 8/1995 | |
| JP | 09-083001 | 3/1997 | |
| JP | 08340176 A | * 5/1997 | .............. 228/179.1 |
| JP | 09-135035 | 5/1997 | |
| JP | 09135035 A | * 5/1997 | .............. 228/179.1 |
| JP | 09-295133 | 11/1997 | |
| JP | 09-326497 | 12/1997 | |

* cited by examiner

*Primary Examiner*—Tom Dunn
*Assistant Examiner*—L. Edmondson
(74) *Attorney, Agent, or Firm*—Hogan & Hartson, L.L.P.

(57) ABSTRACT

A plurality of solder bumps are arranged in a row at regular pitch in a lead wire soldering region of a solar battery. A soldering apparatus for soldering a lead wire to the lead wire soldering region via the solder bumps comprises a lead wire feeding section for feeding out the lead wire. An end of the lead wire in the lead wire feeding section is chucked and the lead wire is laid over all length of the row of solder bumps. The soldering apparatus further comprises a soldering unit for soldering the lead wire onto the solder bump. The soldering unit has a lead wire holding member for holding the lead wire on a solder bump and a soldering iron. The soldering apparatus repeats an operation for welding the lead wire to the solder bump by means of the soldering iron, while the lead wire is held by the lead wire holding member.

14 Claims, 13 Drawing Sheets

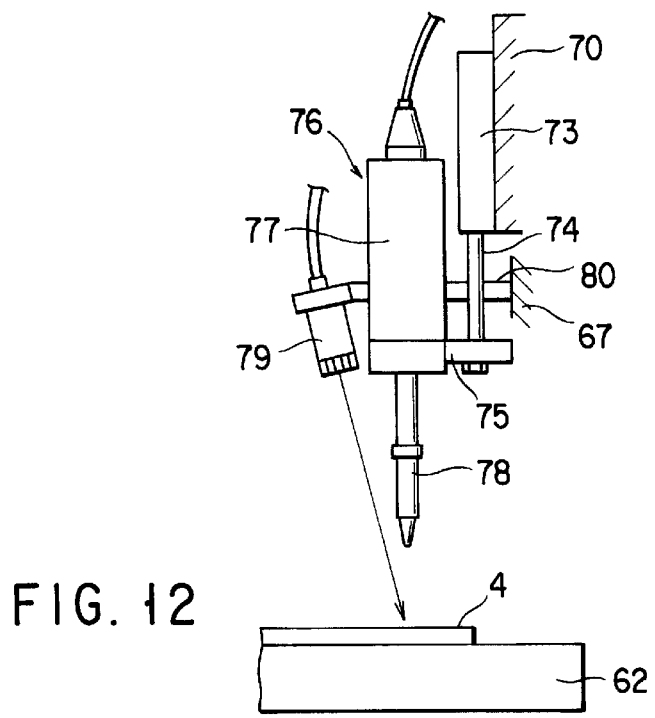
FIG. 12
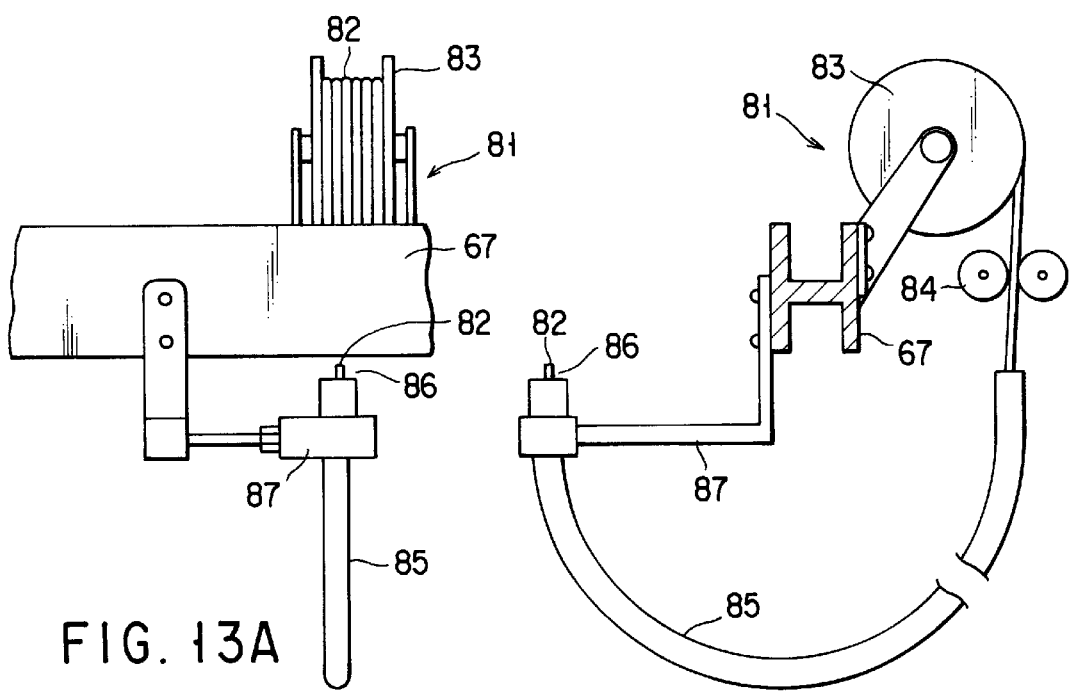
FIG. 13A
FIG. 13B

1

METHOD AND APPARATUS FOR AUTOMATICALLY SOLDERING A LEAD WIRE TO A SOLAR BATTERY

CROSS-REFERENCE TO RELATED APPLICATIONS

This application is based upon and claims the benefit of priority from the prior Japanese Patent Applications No. 11-276360, filed Sep. 29, 1999; No. 11-292730, filed Oct. 14, 1999; No. 11-305533, filed Oct. 27, 1999; No. 11-312399, filed Nov. 2, 1999; and No. 11-357400, filed Dec. 16, 1999, the entire contents of which are incorporated herein by reference.

BACKGROUND OF THE INVENTION

The present invention relates to a method and an apparatus for automatically soldering a lead wire to a solar battery to connect the lead wire to positive and negative electrodes of a photovoltaic module for directly converting solar energy to electrical energy and deriving an output from the photovoltaic module.

A photovoltaic module for directly converting solar energy to electrical energy has a layered body, in which a transparent electrode layer, a photovoltaic semiconductor layer and a rear surface electrode layer are laminated in this order on an insulating substrate, such as a glass substrate. The layered body is divided into a plurality of photoelectric converting cells by a laser scriber or the like. The photovoltaic cells are electrically connected to one another in series or parallel.

As disclosed in, for example, Jpn. Pat. Appln. KOKAI Publications Nos. 9-326497, 9-135035 and 9-83001, a photovoltaic module has lead wire soldering regions at both end portions.

In the lead wire soldering regions, a number of solder bumps serving as positive and negative electrodes are formed in a row at regular intervals. Lead wires are connected to the solder bumps, so that an output of the photovoltaic module can be derived. The lead wires are connected to a terminal box attached to the rear surface of the photovoltaic module.

Further, for example, Published Japanese Patent No. 2691685 and Jpn. Pat. Appln. KOKAI Publication No. 9-295133 disclose an apparatus for forming solder bumps in lead wire soldering regions of a photovoltaic module. With the apparatus, bumps are soldered efficiently and securely by applying ultrasonic vibration to a soldering iron.

In the lead wire soldering regions of the photovoltaic module, solder bumps having a spot diameter of about 2 mm are formed in a row at intervals of about 20 mm and soldered by means of ultrasonic soldering. Thereafter, lead wires made of solder-plated copper foil or the like are placed along the row of the solder bumps. The lead wires are pressed on the solder bumps by a soldering iron, while the lead wires are heated from above. Thus, the lead wires are soldered to the solder bumps.

Conventionally, when lead wires are connected to the lead wire soldering regions on both sides of the photovoltaic module, first, solder bumps are formed as preliminary solder in the lead soldering regions, thereafter lead wires made of solder-plated copper foil or the like are placed along the row of the solder bumps, and the lead wires are soldered to the solder bumps. These process are performed by manual works.

Therefore, when the lead wires are arranged along the row of the solder bumps and the soldering iron is pressed against the lead wires from above, the lead wires may be shifted or wrinkled. To solve this problem, weights are hung from the ends of the lead wires, so that tension is applied to the lead wires by the gravity of the weights during the soldering process.

However, the manual work of soldering lead wires to solder bumps is inefficient, requires a number of steps for mass production, and increases costs. In addition, since the lead wires are soldered with tension applied to the lead wires by the weights, the lead wires soldered between solder bumps are strained. Under these conditions, if the photovoltaic module is mounted on the roof of a building or the like, the lead wires may be contract when it is cooled, resulting in damage or removal from the solder bumps.

Further, the lead wires are connected to the lead wire soldering regions on both sides of the photovoltaic module in the two steps of: forming preliminary solder bumps in the lead wire soldering regions; and placing the lead wires made of solder-plated copper foil or the like along the row of the solder bumps and soldering the lead wires to the solder bumps. Therefore, attachment of the lead wires is complicated and inefficient.

In the case of a large-size photovoltaic module, the insulating substrate has a size of 910 mm×455 mm, and solar battery sub-modules are formed on the substantially overall surface of the insulating substrate. In the case of a small-size photovoltaic module which is mounted on roofing tiles, likewise, a transparent electrode layer, a photovoltaic semiconductor layer and a rear surface electrode layer are laminated in this order on an insulating substrate of the required small size. The layered body is divided into a plurality of photoelectric converting cells by a laser scriber or the like. The photoelectric converting cells are electrically connected to one another in series or parallel.

A photovoltaic module may be produced as follows: a plurality of solar battery sub-modules are formed with dividing regions interposed therebetween on an insulating substrate; and thereafter the insulating substrate is cut at the dividing regions, so that a plurality of photovoltaic modules can be formed.

Then, belt-shaped lead wires made of solder-plated copper foil or the like are soldered to positive and negative electrodes of each solar battery sub-module. The ends of the lead wires are connected to the terminal box attached to the rear surface of the photovoltaic module in order to derive an output.

Conventionally, in the case of a small-size solar battery, solar battery sub-modules are formed on an insulating substrate of that size in the same manner as in the case of a normal size substrate. When producing so-called multiple photovoltaic modules after forming a plurality of solar battery sub-modules on the insulating substrate, the insulating substrate is cut at the dividing regions to form a plurality of photovoltaic modules and the lead wires are connected to the lead wire soldering regions on both sides of each photovoltaic module. In other words, the solder bumps are first formed by means of a bump soldering iron in the lead wire soldering regions on both sides of the divided photovoltaic module, and thereafter the lead wires are soldered to the solder bumps by means of a lead wire soldering iron.

As described above, when a layered body is formed on a small-size insulating substrate or scribed by a laser, it is troublesome to frequently convey the substrate or a film forming apparatus and a laser scriber. Moreover, an additional jig or carrier, or an additional work, such as changing of the work pattern for laser processing, is required to fix or convey the insulating substrate to the film forming apparatus or the laser scriber. For this reason, the forming or laser-scribing of a layered body is inefficient and costly. Furthermore, when the lead wires are soldered to the lead wire soldering regions on both end portions of the small-size photovoltaic module, it is troublesome to convey the battery module to or from a mount table, whether the soldering is carried out by hands or an automatic soldering apparatus. Further, since the soldering cannot be carried out continuously, the work is insufficient, resulting in an increase in costs.

To guide an output from the photovoltaic module to the terminal box mounted on the rear surface of the module, as disclosed in Jpn. Pat. Appln. KOKAI Publication No. 9-326497, lead wires connected to the terminal box are soldered to positive and negative electrodes formed on both ends of the photovoltaic module. The soldering is carried out in the state where an electrode is brought close to or overlap an end portion of the lead wire, so that the solder is deposited across the electrode and the lead wire. Likewise, according to the conventional art, when the direction of a wire is to be changed in the middle of a conducting path from the electrode to the terminal box, first and second lead wires are individually prepared, the end portions of the lead wires are caused to intersect at right angles, and solder is deposited at the intersection. Thus, the direction of the conducting path is changed.

However, according to the aforementioned conventional structure, the electrode and the lead wire to be soldered are merely brought close to or overlap each other, and are not bounded to each other. Therefore, when they are soldered, the relative position therebetween is liable to be deviated and. Since they must be soldered taking account of this matter, the soldering workability is low. In addition, the reliability of the soldering interconnection may be lowered due to the positional deviation. Under the circumstances, it is desired to increase the workability and the reliability of the soldering in order to improve the quality of the photovoltaic modules.

BRIEF SUMMARY OF THE INVENTION

An object of the present invention is to provide a method and an apparatus for soldering a lead wire to a solar battery, which can automatically connect lead wires to a row of solder bumps formed in a lead wire soldering region of a solar battery, so that the working efficiency can be improved.

According to the present invention, a lead wire is fed out from a lead wire feeding section located at an end portion of a row of solder bumps, and laid over all length of the row. Thereafter, the lead wire is held on the solder bump, while the lead wire is welded to the solder bump, beginning with the top end of the lead wire. The above operation and an operation of releasing the lead wire are repeated. Then, the lead wire, from the top end toward the rear end, is successively soldered to the solder bumps. Thus, the lead wire can be soldered to the solder bumps at high speed, thereby improving the working efficiency. In addition, the tension of the lead wire is kept substantially constant, while the lead wire is soldered to the solder bumps. Therefore, the lead wire is prevented from being wrinkled or cut, resulting in the advantage that an even thin and brittle lead wire can be soldered reliably.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 12 is a side view of a bump soldering iron of the second embodiment;

FIG. 13A is a front view of a solder supplying mechanism of the second embodiment;

FIG. 13B is a side view of the solder supplying mechanism of the second embodiment;

DETAILED DESCRIPTION OF THE INVENTION

A first embodiment of the present invention will be described with reference to FIGS. 1 to 9.

Figure 1:
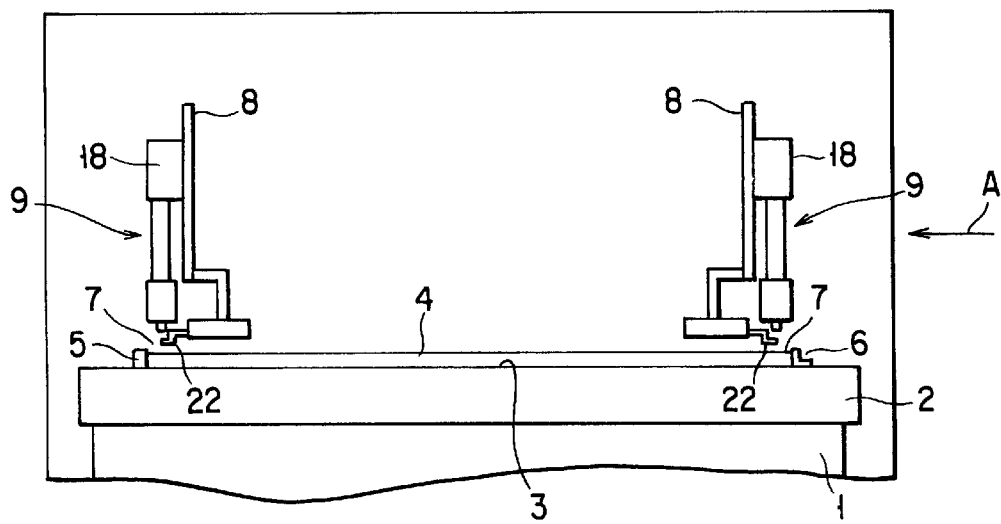
FIG. 1 is a schematic front view of an apparatus for soldering a lead wire to a solar battery according to a first embodiment of the present invention.
Figure 2:
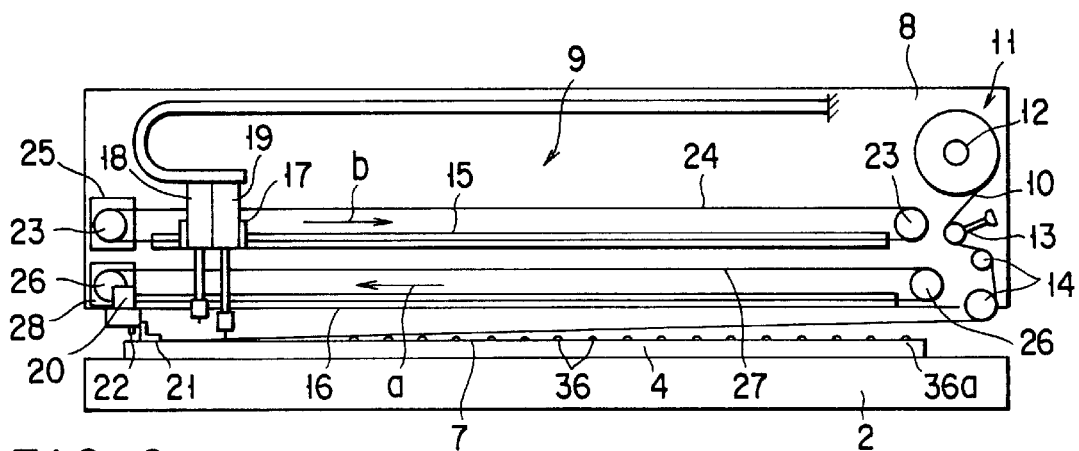
FIG. 2 is a schematic side view of the apparatus of the first embodiment as viewed from the direction of the arrow A shown in FIG. 1.

FIGS. 1 and 2 show a schematic structure of an apparatus for soldering a lead wire to a solar battery. A mount table 2 is provided on a base 1. A solar battery 4 (to be detailed later) is transferred to and mounted on a mount surface 3 of the mount table 2 with its film forming surface facing upward.

The mount surface 3 has a plurality of abutting projections 5 for positioning the solar battery 4 in X and Y directions. The abutting projections 5 are retractably projected in the vertical direction. A pusher 6 for pressing the solar battery 4 against the abutting projections 5 is formed on the end of the mount surface 3 opposite to the abutting projections 5. In the state where the solar battery 4 is positioned in the X and Y directions, the abutting projections 5 and the pusher 6 immovably support the solar battery 4, when soldering is performed.

A pair of frames 8 corresponding to lead wire soldering regions 7 of the solar battery 4 are provided on the mount table 2. The pair of frames 8 have automatic soldering mechanisms 9 for automatically soldering lead wires 10 to the lead wire soldering regions 7. Since the automatic soldering mechanisms 9 have the same structure, one of them will be described below.

As shown in FIG. 2, the frame 8 is mounted upright over the entire length of the mount table 2 in the front-to-back direction. A lead wire feeding section 11 for feeding the lead wire 10 is provided at an end portion of the frame 8. The lead wire 10, a belt-like material made of solder-plated copper foil or the like, is wound around a bobbin 12. The lead wire 10 fed out from the bobbin 12 is guided to the lead wire soldering region 7 via a torque control roller 13 for adjusting tension and a plurality of guide rollers 14. The frame 8 has a first guide rail 15 and a second guide rail 16 extending horizontally in all the length in the longitudinal direction thereof in upper and lower stages. A first movable base 17 is provided on the first guide rail 15 in the upper stage so as to be movable stepwisely in the longitudinal direction. First and second soldering units 18 and 19 are mounted adjacent to each other along the direction of movement on the first movable base 17. A second movable base 20 is provided on the second guide rail 16 in the lower stage so as to be movable stepwisely in the longitudinal direction. A lead wire chuck mechanism 21 for chucking the top end of the lead wire 10 and a cutter mechanism 22 for cutting the lead wire 10 are provided on the second movable base 20.

Timing pulleys 23 are provided in both end portions of the first guide rail 15 in the longitudinal direction. A timing belt 24 is looped over the timing pulleys 23. One of the timing pulleys 23 is connected to a first stepping motor 25 rotatable in normal and reverse directions. An intermediate portion of the timing belt 24 is connected to the first movable base 17. As the timing belt 24 moves, the first and second soldering units 18 and 19 are moved along the lead wire soldering region 7.

Timing pulleys 26 are provided in both end portions of the second guide rail 16 along the longitudinal direction. A timing belt 27 is looped over the timing pulleys 26. One of the timing pulleys 26 is connected to a second stepping motor 28 rotatable in normal and reverse directions. An intermediate portion of the timing belt 27 is connected to the second movable base 20. As the timing belt 27 moves, the lead wire chuck mechanism 21 and the cutter mechanism 22 are moved along the lead wire soldering region 7.

Figure 3:
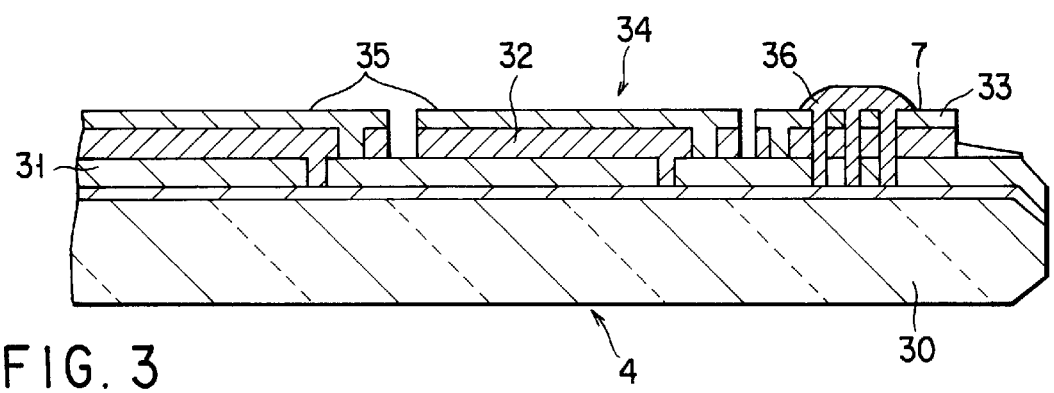
FIG. 3 is a cross-sectional view of the solar battery of the first embodiment.

The solar battery 4 will now be described. As shown in FIG. 3, the solar battery 4 comprises a layered body 34 in which a transparent electrode layer 31, a photovoltaic semiconductor layer 32 and a rear surface electrode layer 33 are laminated in this order on an insulating substrate 30, such as a glass substrate. The layered body 34 is divided into a plurality of photoelectric converting cells 35, which are electrically connected to one another.

Figures 4A, 4B:
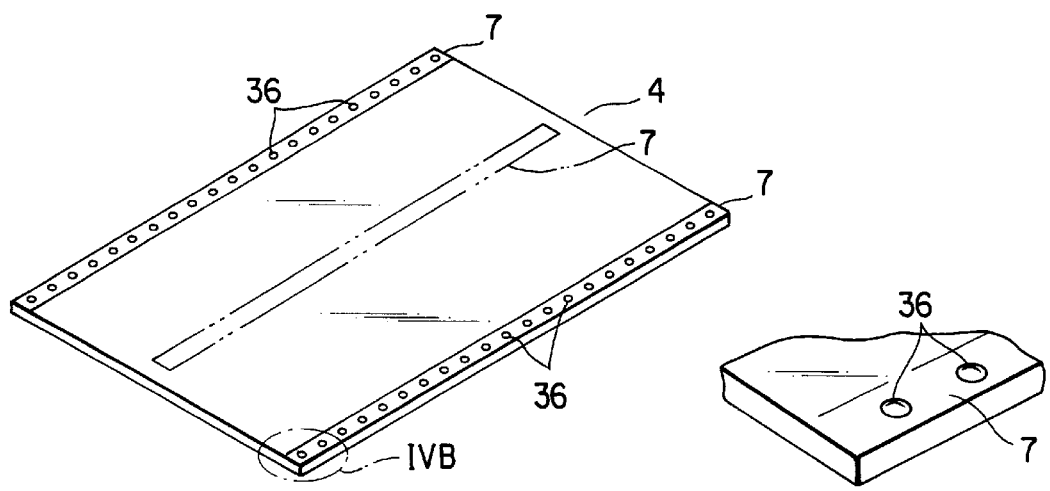
FIG. 4A is a perspective view of the solar battery of the first embodiment on which solder bumps are formed.
FIG. 4B is an enlarged perspective view of the third embodiment showing the portion IVB shown in FIG. 4A.

As shown in FIG. 4, the solar battery 4 has the lead wire soldering regions 7 on its both end portions. Solder bumps 36 are formed in advance on each lead wire soldering region 7 at regular intervals to form a row. A lead wire soldering region 7 may be formed in a central portion of the solar battery 4, as well as in both end portions.

Figure 5:
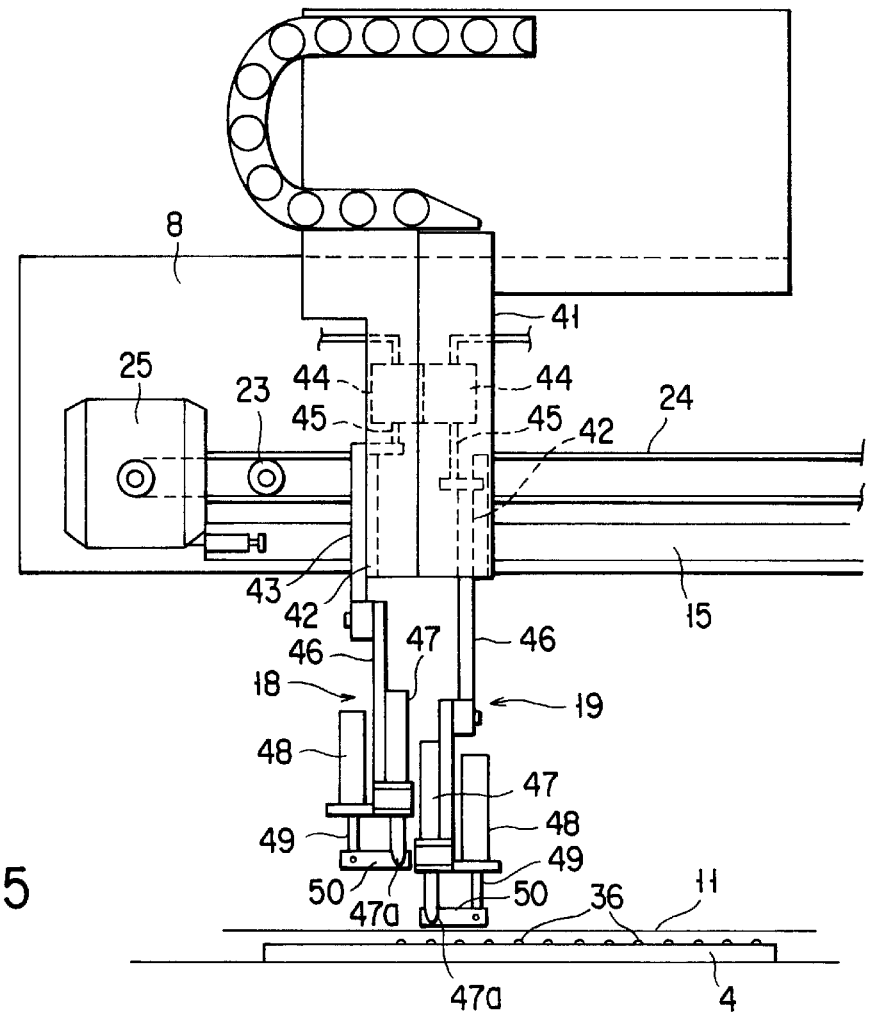
FIG. 5 is a front view of a soldering unit of the first embodiment.

The first and second soldering units 18 and 19 will be described. As shown in FIG. 5, the first and second soldering units 18 and 19 have the same structure. Each soldering unit has a unit body 41 in which an LM guide (linear motion guide) 42 extends in the vertical direction. An elevating member 43 is supported by the LM guide 42 so as to be movable up and down. The elevating member 43 is connected to an elevating rod 45 of a servo motor 44 fixed to the unit body 41, so that it can be moved up and down.

The elevating member 43 is extended downward from the unit body 4. A supporting plate 46 extending downward is connected to the elevating member 43. A soldering iron 47 is fixed to the supporting plate 46 along the vertical direction. A tip 47a of the soldering iron faces the lead wire soldering region 7 of the solar battery 4 in which the soldering bumps 36 are formed.

An air cylinder 48 is attached to the supporting plate 46, adjacent to the soldering iron 47, along the vertical direction. A lead wire holding member 50 is fixed to the top end portion of an elevating rod 49 of the air cylinder 48. The lead wire holding member 50 serves to hold the lead wire 10 on the solder bump 36 to ensure the soldering, when the lead wire 10 is welded to the soldering bump 36.

The first and second soldering units 18 and 19 having the above structure are arranged symmetrically, so that the soldering irons 47 are close to each other. The distance between the tips 47a of the soldering irons 47 coincides with the pitch of the solder bumps 36 formed in the lead wire soldering region 7.

Figure 6:
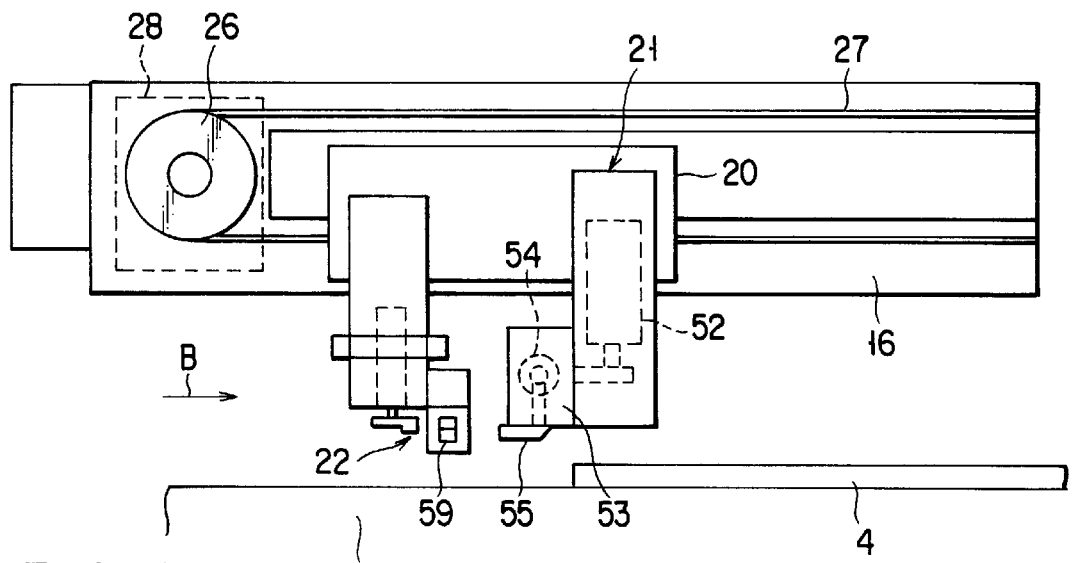
FIG. 6 is a side view of a lead wire chuck mechanism and a cutter mechanism of the first embodiment.
Figure 7:
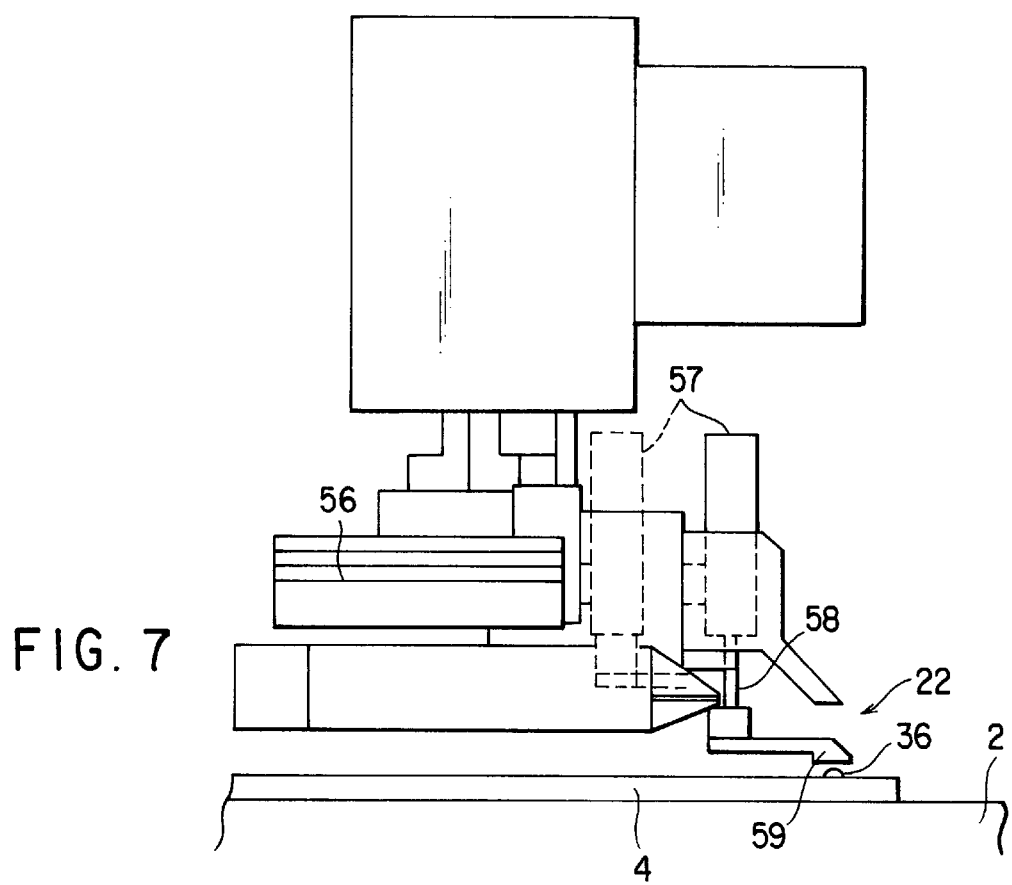
FIG. 7 is a diagram showing the first embodiment as viewed from the direction of the arrow B shown in FIG. 6.

The lead wire chuck mechanism 21 and the cutter mechanism 22 for cutting the lead wire 10 will be described below. As shown in FIGS. 6 and 7, a supporting member 53 is mounted on the second movable base 20. The supporting member 53 can be moved up and down by a first air cylinder 52 extending in the vertical direction, so as to approach and remove from the solar battery 4. An air chuck 55 is mounted on the supporting member 53. The air chuck 55 can approach and remove from the lead wire soldering region 7 from the side by means of a second air cylinder 54 extending in the horizontal direction.

An air slide table 56 is mounted on the second movable base 20 so as to be movable in the horizontal direction. A third air cylinder 57 extending in the vertical direction is provided at a distal end of the air slide table 56. The third air cylinder 57 has a slide rod 58, to which air nippers 59 constituting the cutter mechanism 22 are connected. Therefore, the air nippers can move to and from the lead wire soldering region 7, so that it can approach the lead wire soldering region 7, when it is to cut the lead wire 10.

A method for soldering a lead wire by means of the above lead wire soldering apparatus for a solar battery will be described below.

The solar battery 4 transferred into the lead wire soldering apparatus is placed on the mount table 2 with the rear surface electrode layer 33 directed up. The solar battery 4 has a number of solder bumps formed in a row at regular intervals in the lead wire soldering region 7 in each end portion thereof. The automatic soldering mechanisms 9 face the lead wire soldering regions 7 on both end portions of the solar battery 4.

First, the lead wire chuck mechanism 21 stands by at a position near the lead wire feeding section 11. The top end portion of the lead wire fed from the bobbin 12 of the lead wire feeding section 11 is chucked by the air chuck 55 of the lead wire chuck mechanism 21.

Figure 8:
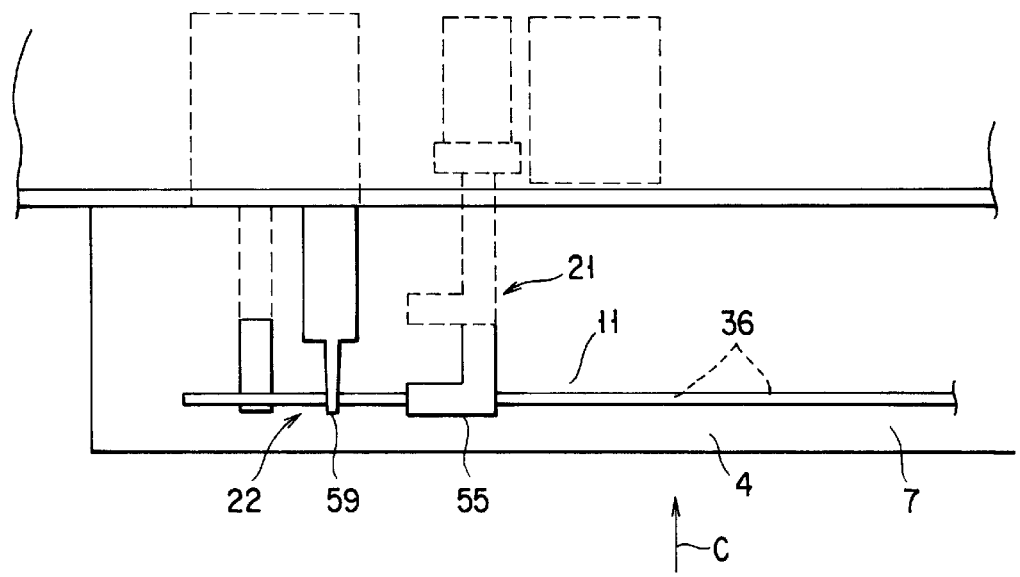
FIG. 8 is a plan view of the first embodiment in which a lead wire is laid across solder bumps.
Figure 9:
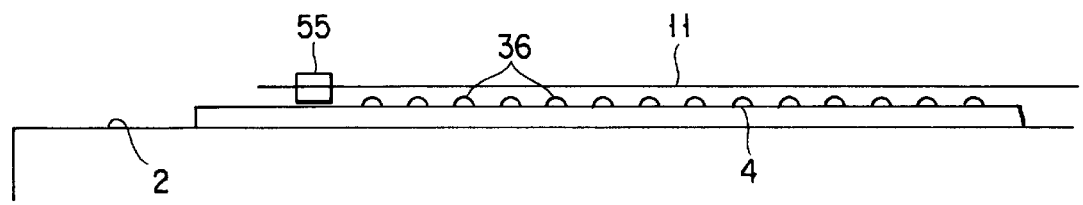
FIG. 9 is a plan view of the first embodiment as viewed from the direction of the arrow C shown in FIG. 8.

In this state, when the second stepping motor 28 provided at an end of the second guide rail 16 is driven, the timing belt 27 is caused to move via the timing pulley 26. The second movable base 20 connected to the timing belt 27 is guided by the second guide rail 16 and moved in the direction of the arrow a (FIG. 2). As the second movable base 20 is moved, the top end portion of the lead wire 10 is drawn in the same direction. Thus, the lead wire 10 wound around the bobbin 12 is fed out. The fed out lead wire 10 is guided over all the length of the row of solder bumps formed in the lead soldering region 7, as shown in FIGS. 8 and 9.

At this time, since the lead wire 10 is looped on the torque roller 13, it has substantially constant tension. When the lead wire chuck mechanism 21 reaches the other end of the second guide rail 16, i.e., the position farthest from the lead wire feeding section 11, the second stepping motor 28 is stopped.

When the first stepping motor 25 provided at an end of the first guide rail 15 is driven, the timing belt 24 is caused to move stepwisely via the timing pulley 23. The first movable base 17 connected to the timing belt 24 is guided by the first guide rail 15 and moved in the direction of the arrow b (FIG. 2). As the first movable base 17 is moved, the first and second soldering units 18 and 19 are moved stepwisely in the same direction.

The pitch of movement of the first and second soldering units 18 and 19 is set twice the pitch of the solder bumps 36. When the tips 47a of the soldering irons 47 are located just above the solder bumps 36 with the lead wire 10 interposed therebetween, the first and second soldering units 18 and 19 are stopped. More specifically, assuming that ordinal numbers (first, second, third . . . ) are consecutively assigned to the solder bumps 36 beginning with the end corresponding to the top end of the lead wire 10 located above the solder bumps, the soldering iron 47 of the first soldering unit 18 faces the first solder bump 36 and the soldering iron 47 of the second soldering unit 19 faces the second solder bump 36.

The first and second soldering units 18 and 19 are operated alternately. When the elevating member 43 of the first soldering unit 18 is lowered by driving the servo motor 44, the lead wire holding member 50 connected to the soldering iron 47 and the air cylinder 48 is lowered. At this time, the air cylinder 48 is operated to cause the lead wire holding member 50 to hold that portion of the lead wire 10, which is near the first solder bump 36 to be soldered, on the first solder bump 36. As a result, the lead wire 10 is prevented from rising. In this state, the lead wire 10 is welded to the first solder bump 36 by means of the tip 47a of the soldering iron 47.

When the soldering by the first soldering unit 18 is completed, the elevating member 43 of the unit 18 is moved up by driving the servo motor 44, and the lead wire holding member 50 connected to the soldering iron 47 and the air cylinder 48 is elevated. At the same time, the elevating member 43 of the second soldering unit 19 is moved down by driving the servo motor 44. In the same manner as described above, the air cylinder 48 of the second soldering unit 19 is operated to cause the lead wire holding member 50 to hold that portion of the lead wire 10, which is near the second solder bump 36 to be soldered, on the second solder bump 36. As a result, the lead wire 10 is prevented from rising. In this state, the lead wire 10 is welded to the second solder bump 36 by means of the tip 47a of the soldering iron 47.

In this manner, the first and second soldering units 18 and 19 are operated alternately. When the lead wire 10 is completely soldered to the first and second solder bumps 36, the first and second soldering units 18 and 19 move twice the pitch of the solder bumps 36. In other words, the soldering iron 47 of the first soldering unit 18 faces the third solder bump 36 and the soldering iron 47 of the second soldering unit 19 faces the fourth solder bump 36. In this state, the first and second soldering units 18 and 19 are operated alternately to solder the lead wire 10 to the respective solder bumps 36.

As described above, the first and second soldering units 18 and 19 are moved stepwisely toward the lead wire feeding section 11. During this movement, the lead wire is welded to the solder bumps 36 in the lead wire soldering region 7. When only the solder bump 36a immediately before the lead wire feeding section 11 remains, the first and second soldering units 18 and 19 are temporarily stopped.

At this time, the air chuck 55 of the lead wire chuck mechanism 21 releases the lead wire 10. When the second stepping motor 28 is driven, the timing belt 27 is moved in the direction opposite to the direction of the allow a mentioned above, and the lead wire chuck mechanism 21 and the cutter mechanism 22 move toward the lead wire feeding section 11 by 1 or 2 pitches.

The lead wire chuck mechanism 21 and the cutter mechanism 22 move to the lead wire soldering region 7 and chuck a middle portion of the lead wire outside of the solder bump 36a to the side nearer to the lead wire feeding section (on the right side of the solder bump 36a in FIG. 2). In this state, the lead wire 10 is cut by the air nippers 59 of the cutter mechanism 22 near the solder bump 36a. Thus, the lead wire 10 wound around the bobbin 12 is divided from the lead wire 10 soldered to the solder bumps 36. At this time, the second soldering unit 19 is operated again, so that the rear end portion of the lead wire 10 is welded to the solder bump 36a. As a result, the lead wire 10 from the top end to the rear end is soldered to the row of solder bumps 36, thus completing the soldering of the lead wire 10 to a solar battery 4.

According to the first embodiment as described above, the lead wires 10 are soldered to the solder bumps 36 formed on the lead wire soldering regions 7 on both sides of the solar battery 4 by simultaneously operating the two automatic soldering mechanisms 9. However, the two automatic soldering mechanisms 9 may be operated one by one to solder the lead wires 10 one at a time.

Further, in the above embodiment, the first and second soldering units 18 and 19 are operated alternately to solder the solder bumps 36 one by one. However, the first and second soldering units 18 and 19 may be simultaneously operated to solder two solder bumps 36 at a time.

As described above, according to the first embodiment, the lead wire can be soldered to the solder bumps at high speed. As a result, the soldering workability can be increased. In addition, the tension of the lead wire is kept substantially constant, while the lead wire is soldered to the solder bumps. Therefore, the lead wire is prevented from being wrinkled or cut, resulting in the advantage that an even thin and brittle lead wire can be soldered reliably.

FIGS. 10 to 17 show a second embodiment of the present invention. Since the solar battery has the same structure as that of the first embodiment, the same reference numeral is used and a description thereof is omitted.

Figure 10:
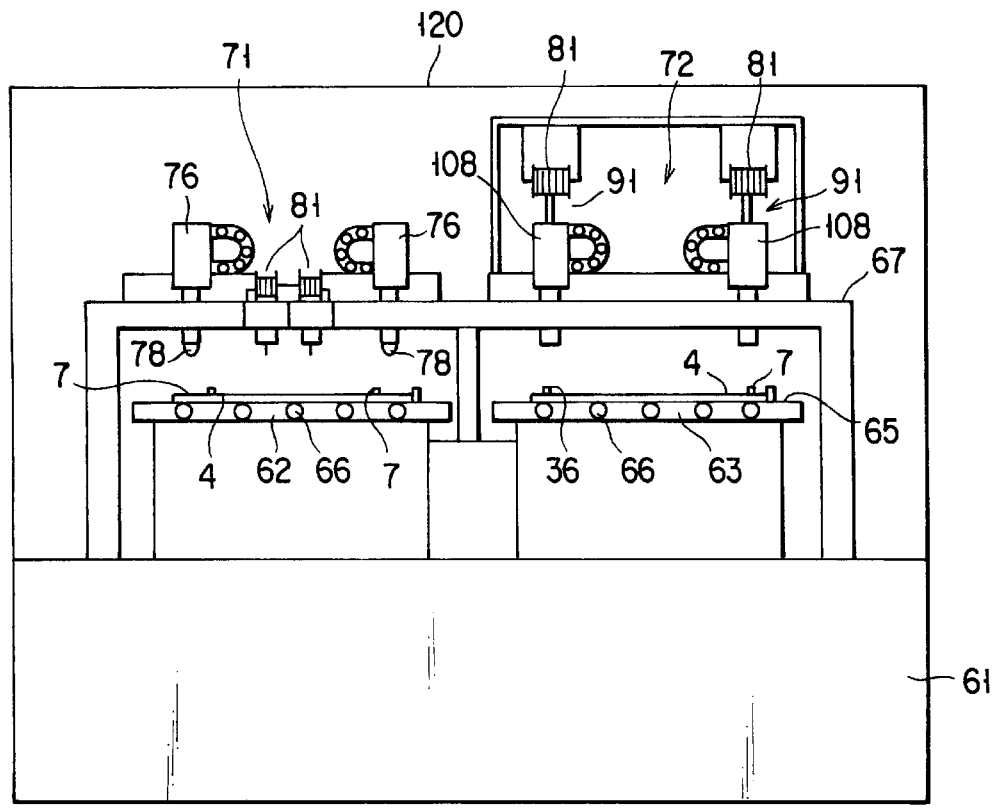
FIG. 10 is a schematic front view of an apparatus for soldering a lead wire to a solar battery according to a second embodiment of the present invention.
Figure 11:
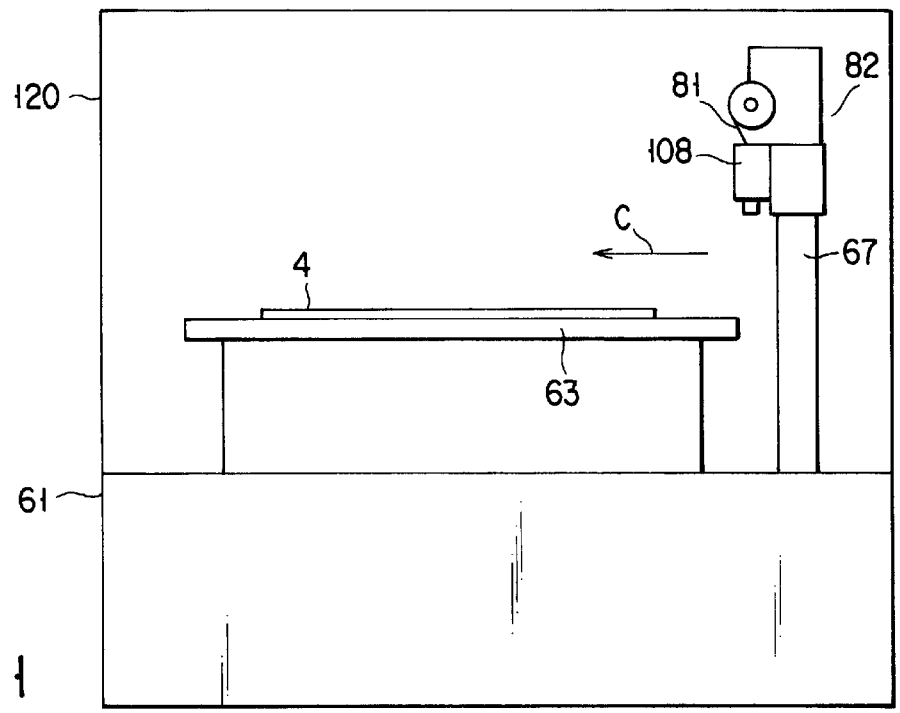
FIG. 11 is a schematic side view of the apparatus for soldering a lead wire to a solder battery according to the second embodiment.

FIGS. 10 and 11 are schematic views showing an apparatus for soldering a lead wire to a solar battery. The apparatus has a base 61, on which a first mount table 62 and a second mount table 63 are arranged side by side on the same plane. Solar batteries 4 are placed on the first and second mount tables 62 and 63 with their film forming surfaces facing upward. Each of the first and second mount tables 62 and 63 has a support portion 65 for immovably support the solar battery 4 in a soldering process, and a transfer mechanism 66 for transferring the solar battery 4 to and from the first or the second mount table 62 or 63.

A gate-like movable frame 67 is mounted on the base 61 so as to bridge over the first and second mount tables 62 and 63. The movable frame 67 is moved stepwise by a driving mechanism (not shown) in the direction of the arrow c pitch by pitch.

A preparatory soldering apparatus 71 is mounted on the movable frame 67 to face the first mount table 62, and a lead wire soldering apparatus 72 is mounted thereon to face the second mount table 63. As the movable frame 67 moves, the preparatory soldering apparatus 71 forms solder bumps on the solar battery 4 placed on the first mount table 62. Simultaneously, the lead wire soldering apparatus 72 solders the lead wire 10 to the solder bumps 36 of the solar battery 4 placed on the second mount table 63.

The preparatory soldering apparatus 71 will now be described in detail. As shown in FIG. 12, the preparatory soldering apparatus 71 has an XY directions driving mechanism 70 attached to the movable frame 67 so as to face the lead wire soldering regions 7 in both sides of the solar battery 4. A servo motor 73, serving as a Z direction driving mechanism, is attached to the XY directions driving mechanism 70. The servo motor 73 has an elevating rod 74, to which a bump soldering iron 76 is attached via a bracket 75 along the vertical direction.

The bump soldering iron 76 comprises an ultrasonic vibrator 77 and an iron 78 incorporating an electric heater (not shown) directly connected to the ultrasonic vibrator 77. The tip of the iron 78 is tapered. A camera 79 is provided near the bump soldering iron 76 to pick up an image of an alignment mark (not shown) formed in a corner portion of the solar battery 4 placed on the first mount table 62. The camera 79 is attached to the movable frame 67 via a bracket 80.

If the bump soldering iron 76 is positioned to the solar battery 4 by pressing the solar battery 4 to a positioning bar without using a camera or an alignment mark, it is unnecessary to provide a camera.

As shown in FIGS. 13A and 13B, a solder supplying mechanism 81 is attached to the movable frame 67 near the bump soldering iron 76. The solder supplying mechanism 81 has a feeding roller 84 for stepwisely feeding linear solder 82 from a bobbin 83 on which the linear solder 82 is wound around. The linear solder 82 is inserted in a guide pipe 85 bent like an arc such that an opening faces up. The guide pipe 85 is a tube made of a material having a small coefficient of friction, for example, Teflon or nylon. A portion of the guide pipe 85 near an upward opening 86 directed upward is attached to the movable frame 67 via a holder 87. The linear solder 82 is projected through the upward opening 86 by a fixed length.

Figure 14:
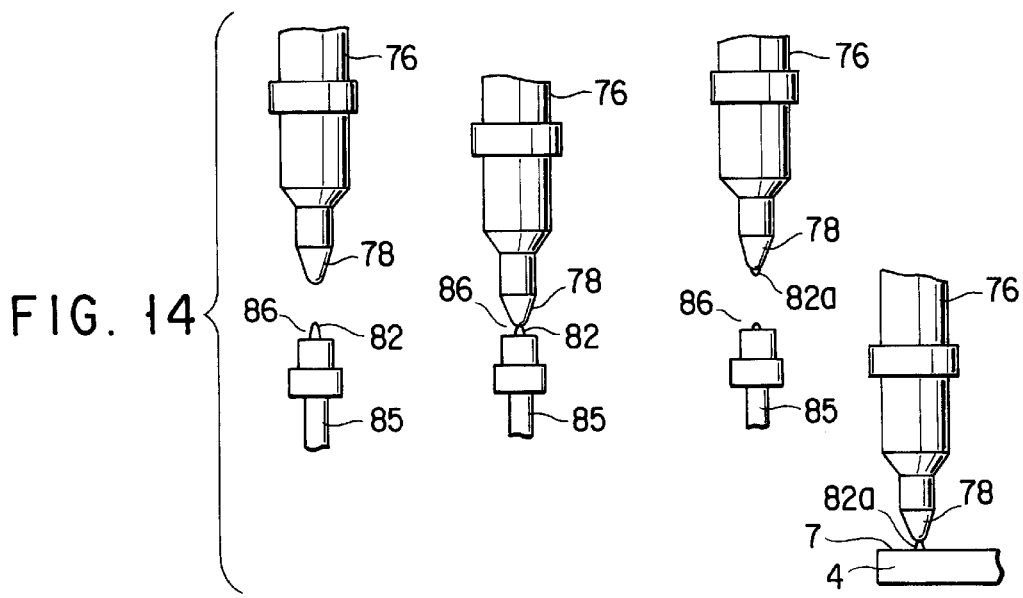
FIG. 14 is front views showing a process of receiving molten solder and forming a solder bump by means of the bump soldering iron of the second embodiment.

To form solder bumps 36 on the lead wire soldering regions 7 on both sides of the solar battery 4 by means of the bump soldering iron 76, the iron 78 of the bump soldering iron 76 is caused to face the upward opening 86 of the solder supplying mechanism 81 by driving the XY directions driving mechanism 70 of the preparatory soldering apparatus 71, as shown in FIG. 14.

When the bump soldering iron 76 is lowered by the servo motor 73, the tip of the iron 78 is brought into contact with the linear solder 82 projected through the upward opening 86. The linear solder 82 is melted by the iron 78 which is heated by the electric heater.

Then, when the bump soldering iron 76 is raised by the servo motor 73, a molten solder 82a of a fixed amount is adhered to the tip of the iron 78, so that the molten solder 82a can be supplied to the solar battery 4 on the first mount table 62. The bump soldering iron 76 is caused to face the lead wire soldering region 7 of the solar battery 4 on the mount table 62 by driving the XY directions driving mechanism 70 of the preparatory soldering apparatus 61. Then, when the bump soldering iron 76 is lowered by the servo motor 73, the molten solder 82a adhered to the tip of the iron 78 is brought into contact with the lead wire soldering region 7, thereby forming a solder bump 36.

At this time, to detect the height of the solar battery 4 in the Z direction, the tip of the iron 78 is first brought into contact with the lead wire soldering region 7, to pick out a datum point. Thereafter, the soldering iron 76 is lifted by the servo motor by a predetermined length, and forms the solder bump 36 in the lead wire soldering region 7, while ultrasonic vibration is applied to the iron 78 by the ultrasonic vibrator 77. The above operation is repeated as the movable frame 67 is moved stepwisely pitch by pitch in the direction of the arrow c. As a result, a row of solder bumps 36 are formed on the lead wire soldering region 7.

In the solder supplying mechanism 81, the linear solder 82 is stepwise fed by the feeding roller 84 from the bobbin 83, so that it is projected from the upward opening 86 by a fixed length at a time. Therefore, a fixed amount of the molten solder 82a is adhered to the tip of the iron 78 of the bump soldering iron 76. Accordingly, the solder bumps 36 formed on the lead wire soldering region 7 have substantially the same size. In addition, since ultrasonic vibration is applied to the bump soldering iron 76 while the iron is being pressed against the lead soldering region 7, the solder bumps 36 can be firmly fixed to the region 7.

Figure 15:
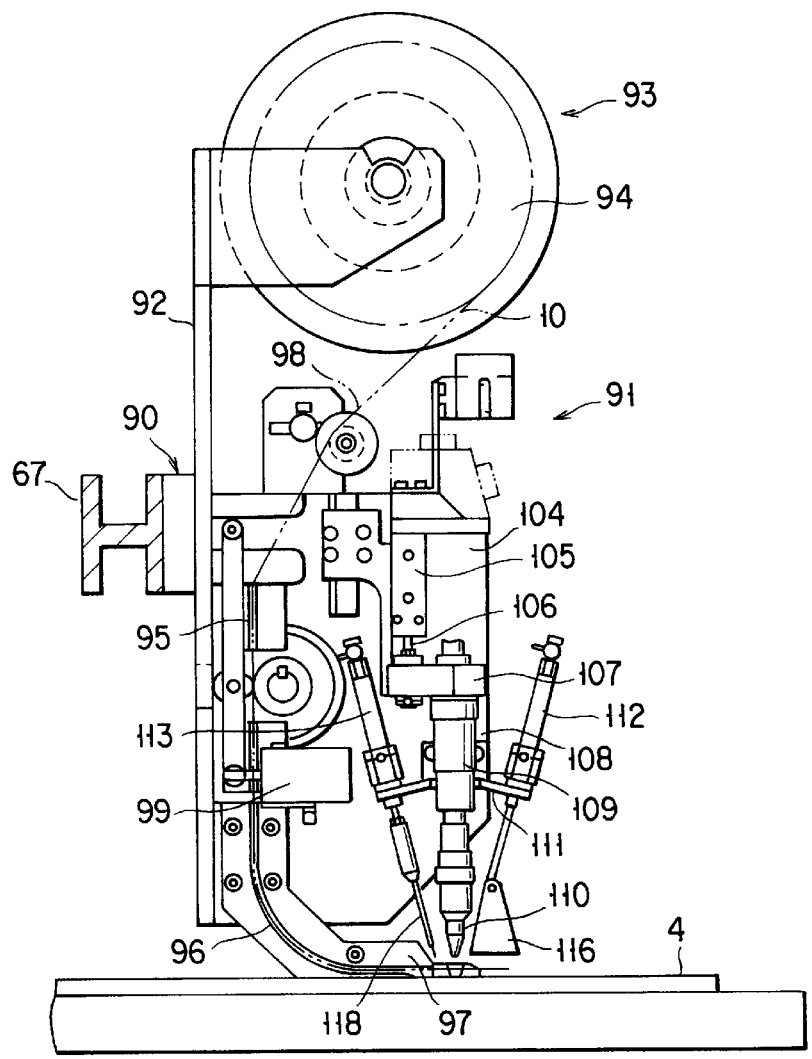
FIG. 15 is a side view of a lead wire supplying and soldering mechanism of the second embodiment.
Figure 16:
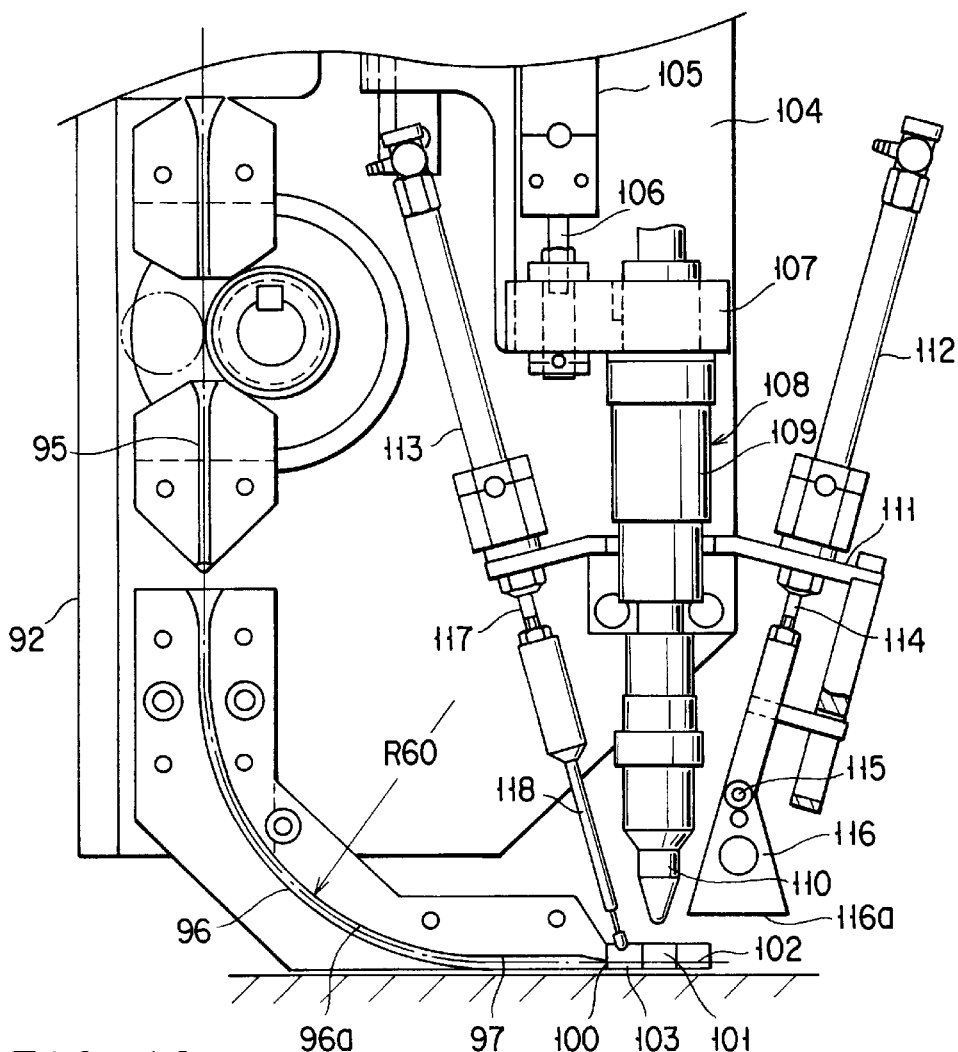
FIG. 16 is a partially enlarged side view of the lead wire supplying and soldering mechanism of the second embodiment.
Figure 17:
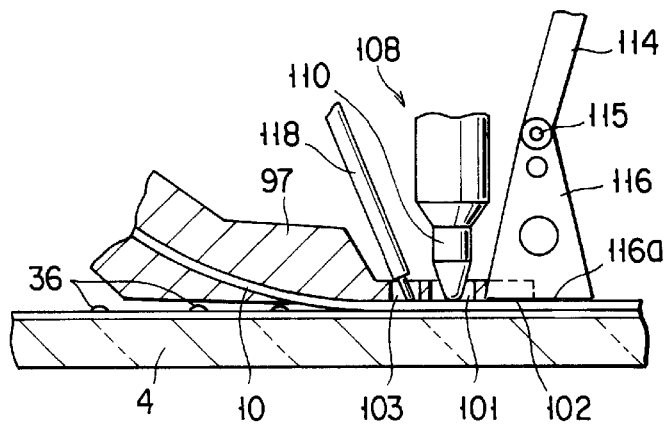
FIG. 17 is an enlarged side view of a lead wire soldering portion of the second embodiment.

The lead wire soldering apparatus 72 will now be described. As shown in FIGS. 15 to 17, a Y direction driving mechanism 90 is attached to the movable frame 67 so as to face the lead wire soldering region 7 of the solar battery 4 on which the solder bumps 36 are formed. A lead wire supplying and soldering mechanism 91 is attached to the Y direction driving mechanism 90 so as to be movable up and down via a Z direction driving mechanism (not shown).

The lead wire supplying and soldering mechanism 91 has an attachment plate 92 movable up and down. A lead wire supplying section 93 for supplying the lead wire 10 is mounted on an upper portion of the attachment plate 92. As in the first embodiment, the lead wire 10 is made of solder-plated copper foil having a width of about 2 mm, and wound around a bobbin 94 rotatably supported by the attachment plate 92.

A vertical guide 95 and an arc guide 96 having a curvature and continuously connected to the lower end of the vertical guide 95 are arranged under the bobbin 94. Further, a horizontal guide 97 is continuously connected to the arc guide 96. The lead wire 10 fed from the bobbin 94, supplied via a guide roller 98, is inserted into the vertical guide 96, the arc guide 96 and the horizontal guide 97 in this order, so that it is guided to the solar battery 4 on the second mount table 63.

A lead wire pressing cylinder 99 is attached to the vertical guide 95. The radius of curvature of a curve portion 96a of the arc guide 96 is R40 mm or more, preferably, R60 mm or more. The horizontal guide 97 has a guide groove 100, which is open downward, i.e., toward the solar battery 4.

The vertical guide 95, the arc guide 96 and the horizontal guide 97 are formed of a gap having a width slightly greater than the thickness of the lead wire 10. At least a portion of the inner surface of the gap that is brought in contact with the lead wire 10 is coated with, for example, Teflon or nylon, so that the lead wire 10 can be slid, guided and supplied smoothly. The smoothing means is not limited to the Teflon or nylon coating. Alternatively, the vertical guide 95, the arc guide 96 and the horizontal guide 97 themselves may be made of Teflon or nylon.

As described above, the horizontal guide 97 has a guide groove 100, which is open downward, i.e., toward the solar battery 4. The horizontal guide 97 also has a large hole 101, a long hole 102 and a small hole 103 bored therethrough toward the guide groove 100. The long hole 102 is located on the top end side of the horizontal guide 97 of the large hole 101, and the small hole 103 is located on the distal end side thereof.

Further, a side plate 104 is formed integral with the attachment plate 92. A first air cylinder 105 is attached to the side plate 104 in the vertical direction. The first air cylinder 105 has an elevating rod 106, to which a lead wire soldering iron 108 is attached via a bracket 107 along the vertical direction.

The lead wire soldering iron 108 comprises an ultrasonic vibrator 109 and an iron 110 incorporating an electric heater (not shown) directly connected to the ultrasonic vibrator 109. The tip of the iron 110 is tapered. The iron 110 is positioned to face the large hole 101 of the horizontal guide 97 and press the upper surface of the lead wire 10 through the large hole 101. The ultrasonic vibrator 109 is not necessarily provided.

A bracket 111, having an angle and symmetric with respect to the axis of the lead wire soldering iron 108, is attached to the side plate 104. A second air cylinder 112 and a third air cylinder 113 are attached to the bracket 111 at angles on both sides of the lead wire soldering iron 108. The second air cylinder 112 has an elevating rod 114, to which a lead wire holding member 116 is connected by a pin 115. The lead wire holding member 116 is constituted by a substantially triangular plate having a holding portion 116a, the longitudinal direction thereof corresponds to the length direction of the lead wire 10, so that the soldered lead wire 10 can be held over a wide range. The lead wire holding member 116 holds the upper surface of the lead wire 10 through the long hole 102 of the horizontal guide 97.

The third air cylinder 113 has an elevating rod 117, to which a lead wire holding pin 118. The top end portion of the lead wire holding pin 118 is tapered, and holds the lead wire 10 before soldered through the small hold 103 of the horizontal guide 97.

The second air cylinder 112, the first air cylinder 105 and the third air cylinder 113 are sequentially operated in this order. Thus, the soldered lead wire 10 can be held by means of the lead wire holding member 116 over a wide range on the solder bumps formed on the lead wire soldering region 7 of the solar battery 4. Further, the lead wire 10 is pressed against the solder bump 36 by the lead wire soldering iron 108, and held on the next solder bump 36 by the lead wire holding pin 118. In this state, the lead wire 10 is soldered to the solder bump 36.

The preparatory soldering apparatus 71 and the lead wire soldering apparatus 72 including the first and second mount tables 62 and 63 have a dust-proof structure covered by a transparent cover 120. Therefore, the operator can monitor the operation from the outside through the cover 120.

A method for automatically soldering a lead wire to a solar battery will now be described.

A solar battery 4 is transferred into the apparatus for soldering a lead wire to a solar battery, before solder bumps are formed on a few lead wire soldering regions 7 on both sides, or both sides and an intermediate portion therebetween. The solar battery 4 comprises a layered body 34 in which a transparent electrode layer 31, a photovoltaic semiconductor layer 32 and a rear surface electrode layer 33 are laminated in this order on an insulating substrate 30. The layered body 34 is divided into a plurality of photo-electric converting cells 35, which are electrically connected to one another. The solar battery 4 is placed on the first mount table 62 with the rear surface electrode layer 33 facing up.

The solar battery 4 transferred onto the second mount table 63 has solder bumps 36 formed in rows on the lead wire soldering regions 7 on both sides by means of the preparatory soldering apparatus 71. It is transferred by the transfer mechanism 66 from the first mount table 62.

The movable frame 67 is moved stepwise in the direction of the arrow c pitch by pitch. The preparatory soldering apparatus 71 and the lead wire soldering apparatus 72 mounted on the movable frame 67 are operated simultaneously. Thus, solder bumps 36 are formed on the solar battery placed on the first mount table 62, while the lead wire 10 is soldered to the solar bumps on the solar battery placed on the second mount table 63.

When the solar battery 4 is transferred to the first mount table 62 with its rear surface facing up, it is immovably supported by the support portion 65. Then, the movable frame 67 is moved, bridging over the first and second mount tables 62 and 63. The camera 79 of the preparatory soldering apparatus 71 picks up an image of an alignment mark (not shown) formed on the solar battery 4. Based on the read signal output from the camera, the XY directions driving mechanism 70 is operated, so that the bump soldering iron 76 faces the lead wire soldering region 7 of the solar battery 4.

If the positioning of the bump soldering iron 76 is executed by pressing the solar battery 4 to a positioning bar without using a camera or an alignment mark, no camera is provided to the bump soldering iron. In this case, a reference surface of the solar battery 4 is pressed against a fixed positioning bar (not shown) by a movable positioning bar (not shown), thereby setting the solar battery 4 to a predetermined position. The XY directions driving mechanism 70 is operated, so that the bump soldering iron 76 faces the lead wire soldering region 7 of the solar battery 4.

At this time, as shown in FIG. 14, the iron 78 of the bump soldering iron 76 is caused to first face the upward opening 86 of the guide pipe. Then, the bump soldering iron 76 is moved down by the servo motor 73. When the tip of the iron 78 is brought into contact with the linear solder 82 projected through the upward opening 86, the linear solder 82 is melted by the iron 78 heated by the electric heater.

Subsequently, when the bump soldering iron 76 is moved up by the servo motor 73, a molten solder 82a of a fixed amount is adhered to the tip of the iron 78. The bump soldering iron 76 is caused to face the lead wire soldering region 7 of the solar battery 4 on the first mount table 62 by driving the XY directions driving mechanism 70 of the preparatory soldering apparatus 71. Then, when the bump soldering iron 76 is lowered by the servo motor 73, the molten solder 82a adhered to the tip of the iron 78 is brought into contact with the lead wire soldering region 7, thereby forming a solder bump 36.

At this time, to detect the height of the solar battery 4 in the Z direction, the tip of the iron 78 is first brought into contact with the lead wire soldering region 7, to pick out a datum point. Thereafter, the soldering iron 76 is lifted by the servo motor 73 by a predetermined length suitable for a predetermined amount of solder, and forms the solder bump 36 in the lead wire soldering region 7.

The above operation is repeated as the movable frame 67 is moved stepwisely pitch by pitch in the direction of the arrow c. As a result, a row of solder bumps 36 are formed on the lead wire soldering region 7 at regular intervals, from one end to the other end of the solar battery 4.

An operation of the lead wire soldering apparatus 72 will be described. First, the Y direction driving mechanism 90 is operated, so that the lead wire supplying and soldering mechanism 91 faces the lead wire soldering regions 7 on both sides of the solar battery 4, in which solder bumps 36 are formed. At this time, a camera 79 picks up an image of an alignment mark (not shown) formed on the solar battery 4, so that the mechanism 91 can be suitably positioned to the solar battery.

If the solar battery 4 is positioned by pressing the solar battery 4 to the positioning bar without using a camera or an alignment mark, no camera is provided. In this case, the reference surface of the solar battery 4 is pressed against the fixed positioning bar (not shown) by the movable positioning bar (not shown), thereby setting the solar battery 4 to a predetermined position.

Then, when the lead wire supplying and soldering mechanism 91 is lowered by the Z directions driving mechanism, the horizontal guide 97 attached to the attachment plate 92 comes close to the lead wire soldering region 7.

At this time, the lead wire 10 is fed out from the bobbin 94, and sequentially guided through the vertical guide 95, the arc guide 96 and the horizontal guide 97 in this order. Further, it is guided to the lead wire soldering region of the solar battery 4 having the solder bumps 36 through the guide groove 100.

Then, the elevating rod 114 of the second air cylinder 112 is lowered first, so that a wide range of the lead wire 10 is held on the solder bumps 36 by the lead wire holding member 116. Secondly, the elevating rod 106 of the first air cylinder 105 is lowered to press the lead wire 10 against the solder bump 36 by means of the lead wire soldering iron 108. Thirdly, the elevating rod 117 of the third air cylinder 113 is lowered to press the lead wire 10 against the lead wire soldering region 7.

In this state, when the ultrasonic vibrator 109 of the lead wire soldering iron 108 is ultrasonically vibrated, ultrasonic vibration is applied to a pressured contact portion between the lead wire 10 and the solder bump 36 through the iron 110. In addition, the solder of the lead wire 10 and the solder bump 36 are melted by heat generated by the electric heater incorporated in the lead wire soldering iron 108, so that the lead wire 10 is soldered to the solder bump 36. At this time, ultrasonic vibration is not necessarily required. Depending on the circumstances, ultrasonic vibration is not applied.

Upon completion of soldering of the lead wire 10 to one solder bump 36, the first, second and third air cylinders 105, 112 and 113 are sequentially operated in this order. As a result, the elevating rods 106, 114 and 117 are moved up. At the same time, the movable frame 67 is moved by a pitch in the direction of the arrow c, and the lead wire 10 is soldered to the next solder bump 36. The above operation is repeated, thereby connecting the lead wire 10 to the row of solder bumps 36 from one end to the other end of the solar battery 4.

At this time, a wide range of the soldered portion of the lead wire 10 is held by the plate-like lead wire holding member 116 extending along the longitudinal direction of the lead wire. The portion of the lead wire 10, which has not been soldered, is held by the lead wire holding pin 118. The intermediate portion of the lead wire 10, between the portions held by the holding member 116 and the holding pin 118, is soldered to the solder bump 36. Therefore, excessive tension is not exerted on the lead wire 10, and the lead wire 10 is not removed from the solder bump 36 due to heat shrinkage of the soldered lead wire 10.

When the lead wire 10 is completely soldered to the lead wire soldering region 7 over all the length, it is cut at a predetermined position. After the lead wire 10 is cut, the solar battery 4 is transferred out from the second mount table 63 by the transfer mechanism 66, and another solar battery 4 is transferred to the second mount table 63 from the first mount table 62.

Thus, processes of forming solder bumps 36 on the solar battery 4 to soldering the lead wire 10 to the solder bumps 36 can be performed totally automatically. Further, the bump soldering iron 76 and the lead wire soldering iron 108 are controlled to be moved up and down by the servo motors 73 and the first air cylinder 105 to perform soldering. If one of the two soldering irons has trouble, the other soldering iron is temporarily stopped simultaneously. In this case, the soldering irons are stopped at elevated positions. Therefore, the solar battery 4 can be prevented from being broken by the soldering irons.

In the second embodiment, the preparatory soldering apparatus and the lead wire soldering apparatus are mounted on the separate mount tables. However, they can be mounted on the same mount table, so that immediately after preparatory solder bumps are formed, a lead wire can be soldered to the solder bumps. In this case, a preparatory soldering iron unit and a lead wire soldering iron unit are set tandem along the direction of movement of the lead soldering region, so that the lead wire is soldered to the just-formed preparatory solder bumps.

The above structure is complicated, but advantageous in that the solar battery is required to be positioned only once.

According to the second embodiment, formation of the solder bumps on the lead wire soldering regions of the solar battery and connection of the lead wire to the solder bumps are performed automatically. Therefore, the working efficiency can be improved. Further, in association with the downward movement of the lead wire soldering iron, the soldered lead wire is held by the lead wire holding member, the longitudinal direction thereof corresponds to the length direction of the lead wire. Thus, since a wide range of the soldered lead wire is held, the lead wire is prevented from being wrinkled or cut, resulting in the advantage that an even thin and brittle lead wire can be soldered reliably.

Moreover, a material having a small coefficient of friction is used to form the surface of the lead wire supplying section for guiding the lead wire to the lead wire soldering region of the solar battery. Therefore, the inner portion of the lead wire supplying section is prevented from being clogged with the lead wire or damaged due to adhesion of solder of the lead wire to that portion. Accordingly, the lead wire can be supplied smoothly, and automatically connected to the solder bumps formed in the lead wire soldering region, resulting in an increase in working efficiency.

Figures 18A, 18B:
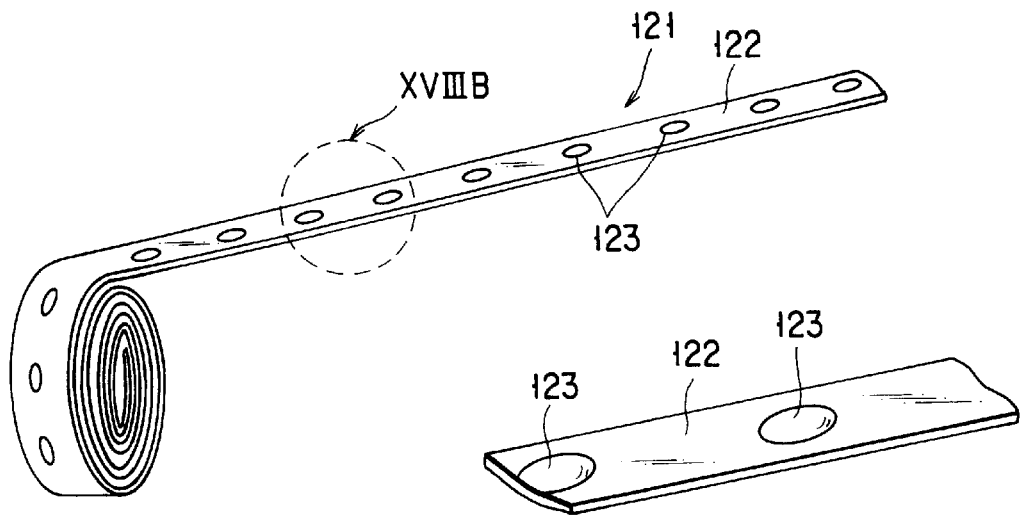
FIG. 18A is a perspective view of a third embodiment of the present invention.
FIG. 18B is an enlarged perspective view of the third embodiment showing the portion XVIII shown in FIG. 18A.

FIGS. 18A, 18B to 21 shows a third embodiment of the present invention. As shown in FIGS. 18A and 18B, a lead wire 121 with solder bumps, made of solder-plated copper foil, comprises a belt-like lead wire 122 having a width of about 2 mm, and solder bumps 123 having a diameter of, for example, 1–2 mm, soldered to one side of the lead wire 122 at intervals of, for example, 10 mm.

Figure 19:
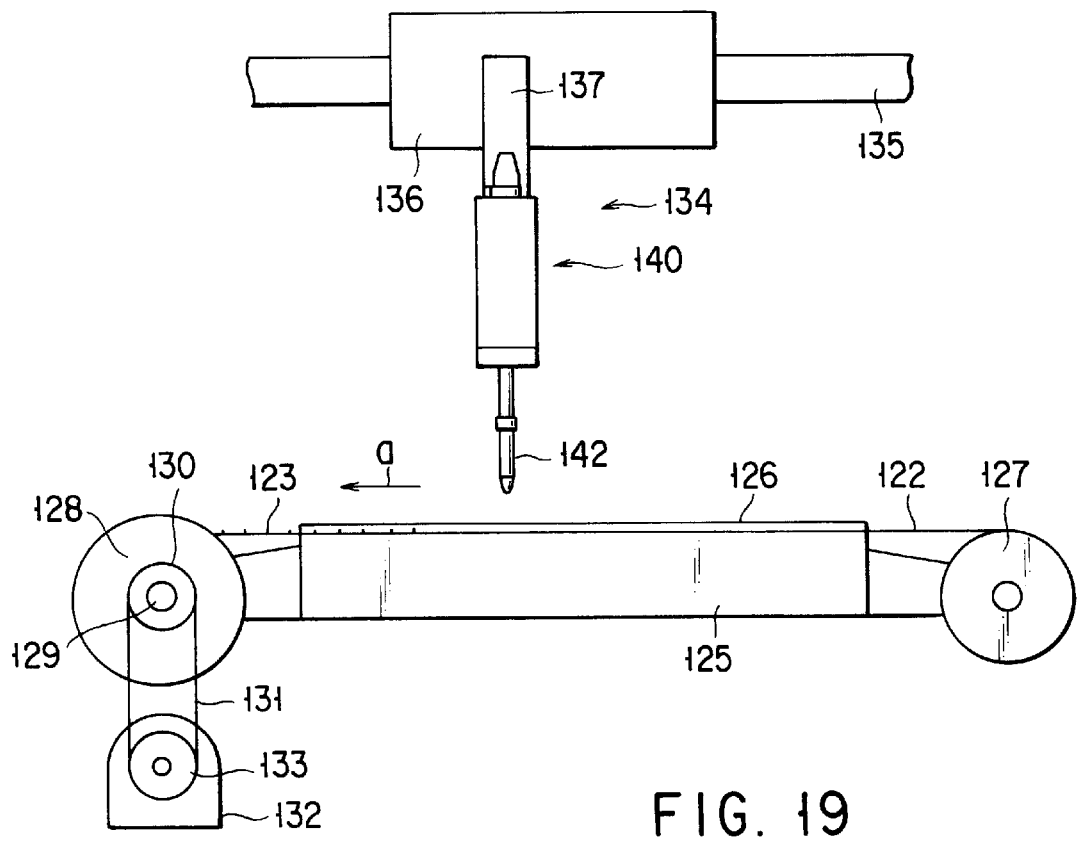
FIG. 19 is a front view of an apparatus for manufacturing a lead wire with solder bumps of the third embodiment.
Figure 20:
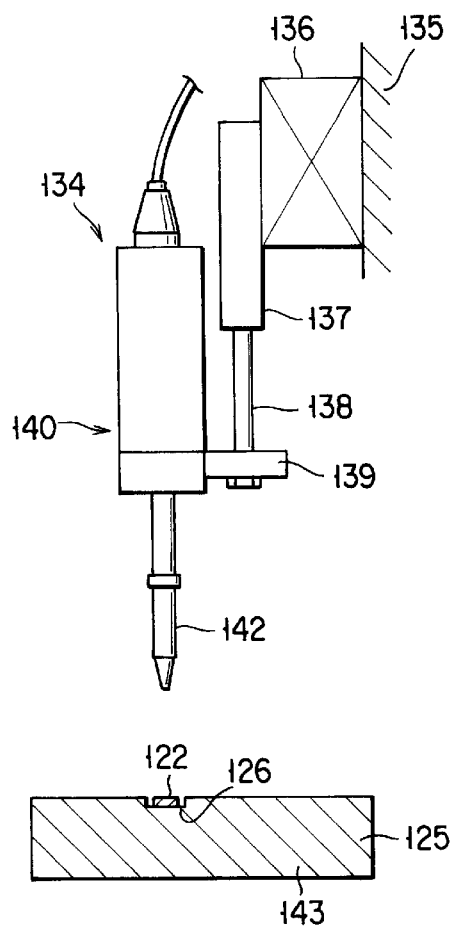
FIG. 20 is a side view of the apparatus for manufacturing a lead wire with solder bumps of the third embodiment.
Figure 21A:
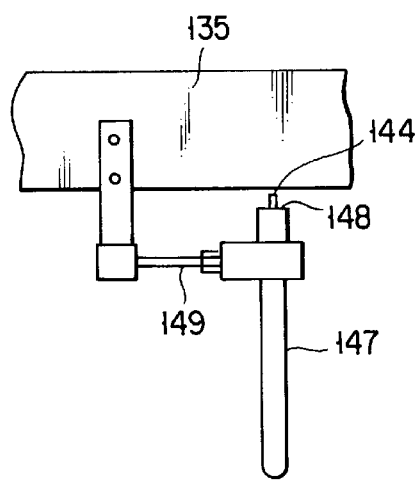
FIG. 21A is a front view of a solder supplying mechanism of the third embodiment.
Figure 21B:
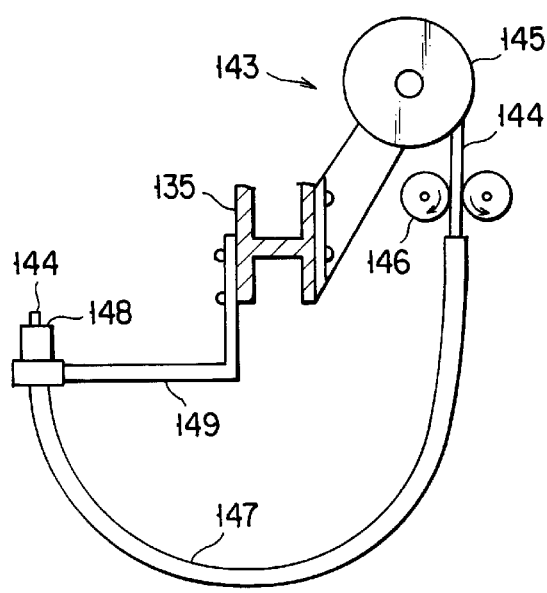
FIG. 21B is a side view of a solder supplying mechanism of the third embodiment.

An apparatus for producing a lead wire with bumps will be described with reference to FIGS. 19 to 21.

The apparatus includes a base 125 having an upper surface on which a lead wire guide groove 126 is formed. The groove 126 is slightly wider than the lead wire 122. A lead wire feeding reel 127 is connected to the base 125 at an end of the lead wire guide groove 126. The lead wire 122 is wound around the lead wire feeding reel 127.

A lead wire take-up reel 128 is connected to the base 125 at the other end of the real wire guide groove 126. The lead wire take-up reel 128 has a rotation shaft 129 to which a pulley 130 is attached. The pulley 130 works along with a pulley 133 of a motor 132 via a belt 131. The motor 132 rotates stepwisely, so that the lead wire 122 stepwisely travels along the lead wire guide groove 126.

A bump soldering apparatus 134 is provided on the base 125 located near the lead wire guide groove 126. The bump soldering apparatus 134 is mounted on a frame 135 via an XY directions driving mechanism 136. An air cylinder 137, serving as a Z direction driving mechanism, is connected to the XY directions driving mechanism 136. The air cylinder 137 has an elevating rod 138, to which a bump soldering iron 140 is connected via a bracket 139 along the vertical direction.

The bump soldering iron 140 comprises an iron 142 incorporating an electric heater (not shown). The tip of the iron 142 is tapered. A solder supplying mechanism 143 is attached to the frame 135 near the bump soldering iron 140. The solder supplying mechanism 143 has a bobbin 145, around which a linear ceramic solder 144 is wound, and a feeding roller 146 for stepwisely feeding out the linear ceramic solder 144 from the bobbin 145. The linear ceramic solder 144 is inserted in a guide pipe 147 bent like an arc such that an opening faces up. The guide pipe 147 is a tube made of a material having a small coefficient of friction, for example, Teflon or nylon. A portion of the guide pipe 147 near an upward opening 148 directed upward is attached to the frame 135 via a holder 149. The linear ceramic solder 144 is projected through the upward opening 148 by a fixed length.

Figure 22:
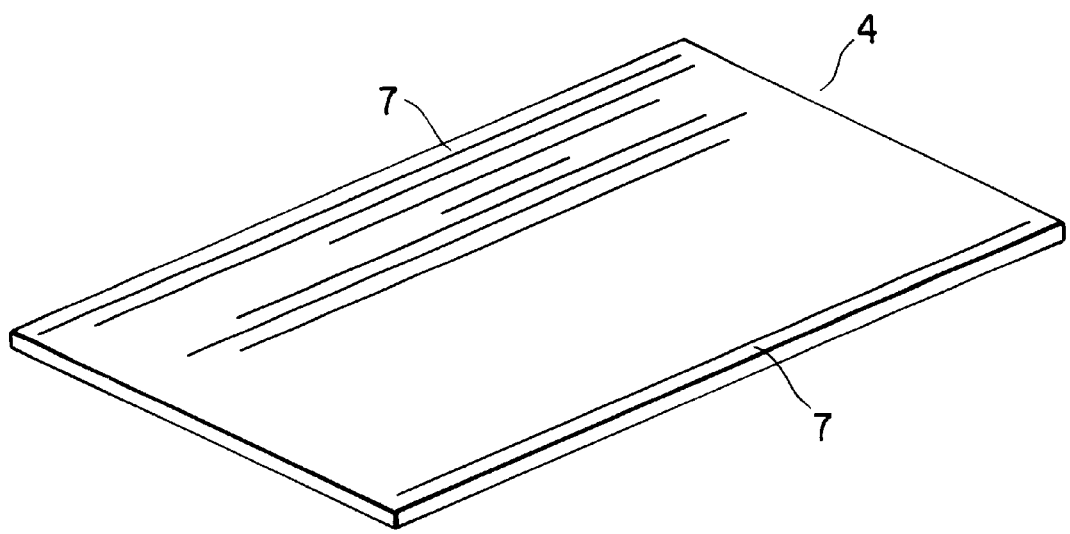
FIG. 22 is a perspective view of a solar battery of the third embodiment.

An apparatus for forming solder bumps 123 on a side of the lead wire 122 by means of the bump soldering iron 140 has the same structure as that of the preparatory soldering apparatus 71 of the second embodiment shown in FIG. 10. An apparatus for soldering the lead wire 121 with solder bumps to a solar battery 4 shown in FIG. 22 is the same as the lead wire soldering apparatus 91 of the second embodiment shown in FIGS. 15 and 16. Therefore, descriptions of these apparatuses will be omitted.

A function of an apparatus for soldering a lead wire to a solar battery according to this embodiment will now be described.

Figure 23:
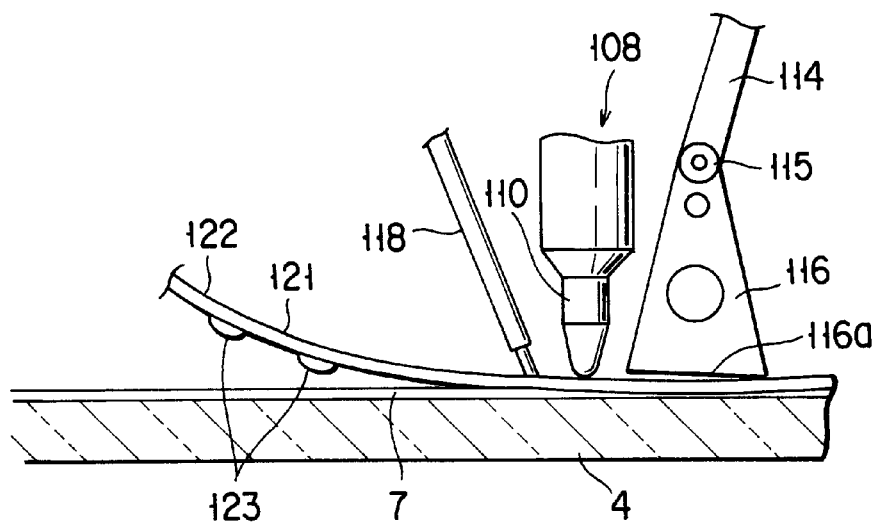
FIG. 23 is an enlarged side view of a lead wire soldering portion of the third embodiment.
Figure 24:
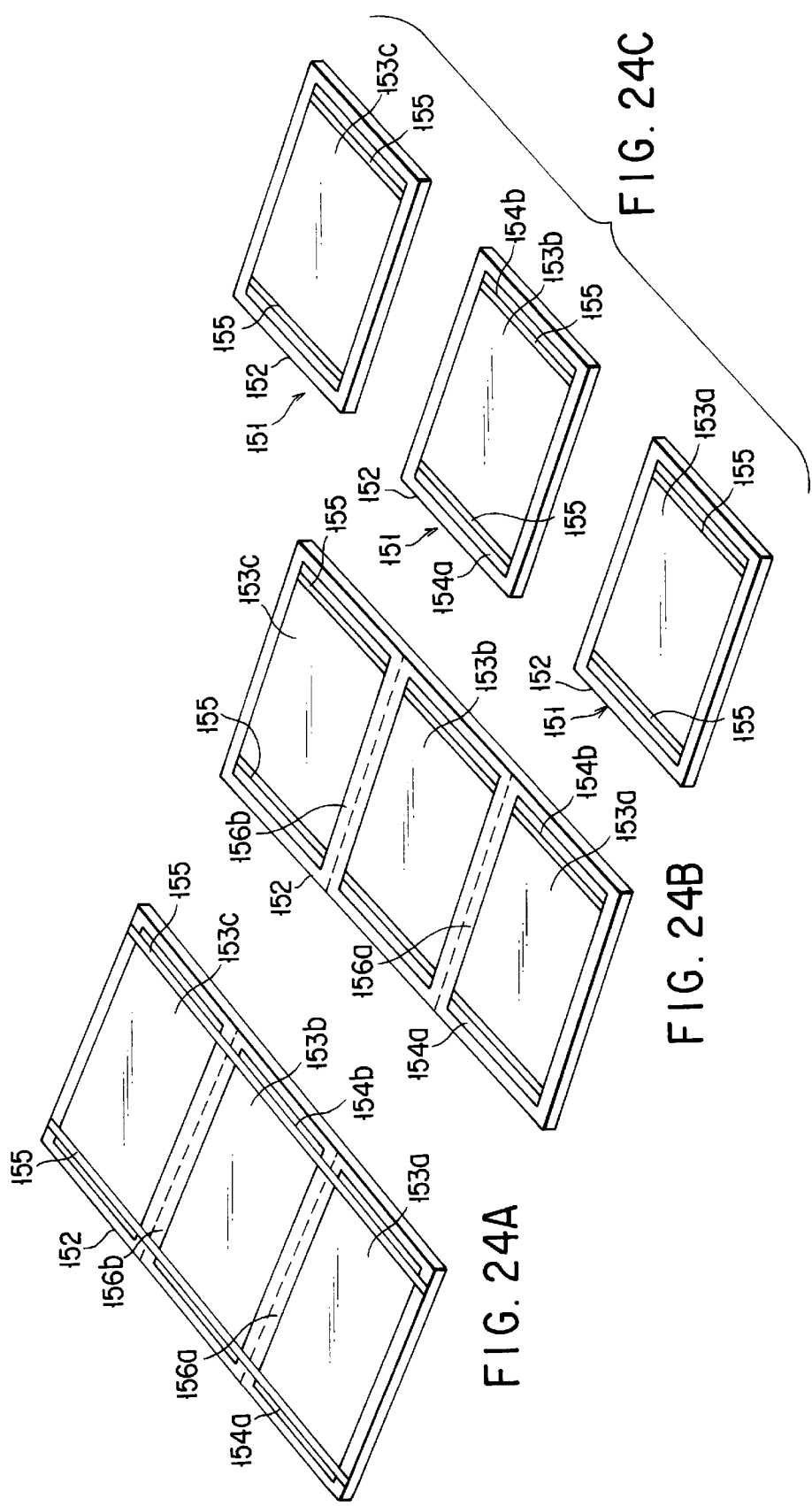
FIG. 24A is a perspective view of a fourth embodiment of the present invention showing a state in which three solar battery sub-modules are formed on an insulating substrate and thereafter lead wires are connected to lead wire soldering regions.
FIG. 24B is a perspective view of the fourth embodiment showing a state in which the lead wire is cut at dividing regions.
FIG. 24C is a perspective view of the fourth embodiment showing a state in which the insulating substrate is cut at dividing regions.

A solar battery 4 transferred to the lead wire soldering apparatus 91 is placed on the mount table with the lead wire soldering regions 7 on both sides thereof facing upward. The lead wire soldering apparatus 91 is stepwisely moved pitch by pitch, with the result that the lead wire 121 with solder bumps are soldered to the lead wire soldering region 7 of the solar battery 4, as shown in FIG. 23.

More specifically, the lead wire 121 with solder bumps is fed out from the bobbin 94 and guided to the lead wire soldering region 7 of the solar battery 4. Then, the elevating rod 117 of the third air cylinder 113 is lowered to press the lead wire 121 with solder bumps against the lead wire soldering region 7.

In this state, when the ultrasonic vibrator 109 of the lead wire soldering iron 108 is ultrasonically vibrated, ultrasonic vibration is applied through the iron 110 to a pressured contact portion between the lead wire 121 with solder bumps and the lead wire soldering region 7. In addition, the solder of the lead wire 121 with solder bumps and the solder bump 123 are melted by heat generated by the electric heater incorporated in the lead wire soldering iron 108, so that the lead wire 121 with solder bumps is soldered to the lead wire soldering region 7.

Upon completion of soldering of the lead wire 121 with solder bumps to one solder bump 123, the first, second and third air cylinders 105, 112 and 113 are sequentially operated in this order. As a result, the elevating rods 106, 114 and 117 are moved up. At the same time, the lead wire soldering apparatus 91 is moved by a pitch, and solders the lead wire 121 to the next solder bump 123. The above operation is repeated, thereby connecting the lead wire 121 with solder bumps to the lead wire soldering region 7 from one end to the other end of the solar battery 4.

At this time, a wide range of the soldered portion of the lead wire 121 with solder bumps is held by the plate-like lead wire holding member 116 extending along the longitudinal direction of the lead wire 121. The portion of the lead wire 121, which has not been soldered, is held by the lead wire holding pin 118. The solder bump in the intermediate portion of the lead wire 121 with solder bumps, between the portions held by the holding member 116 and the holding pin 118, is soldered to the lead wire soldering region 7. Therefore, excessive tension is not exerted on the lead wire 121 with solder bumps, and the lead wire 122 is not removed from the lead soldering region 7 due to heat shrinkage of the soldered lead wire 122.

When the lead wire 121 with solder bumps is completely soldered to the lead wire soldering region 7 over all the length, it is cut at a predetermined position. After the lead wire 121 with solder bumps is cut, the solar battery 4 is transferred out from the mount table, and another solar battery 4 is transferred to the mount table. Thus, soldering of the lead wire 121 with solder pumps to the solar battery can be performed totally automatically.

According to the third embodiment, since the lead wire and the solder bumps are formed integrally into one, the lead wire can be directly connected to the lead wire soldering region of the solar battery without forming preparatory solder bumps in advance. Therefore, the second embodiment has an advantage that the efficiency of soldering lead wires is further improved.

FIGS. 24A to 26 show a fourth embodiment of the present invention. This embodiment is a method for producing photovoltaic modules, in which a plurality of, for example, three solar battery sub-modules are formed on one insulating substrate, and they are cut at dividing regions.

As shown in FIG. 24A, three solar battery sub-modules 153a, 153b and 135c are formed on an insulating substrate 152, and lead wires 155 are connected to lead wire soldering regions 154a and 154b in both side portions of each of the solar battery sub-modules 153a, 153b and 135c. FIG. 24B shows a state in which the lead wires 155 are cut at dividing regions 156a and 156b. FIG. 24C shows a state in which the insulating substrate 152 is cut at the dividing regions 156a and 156b.

Figure 25:
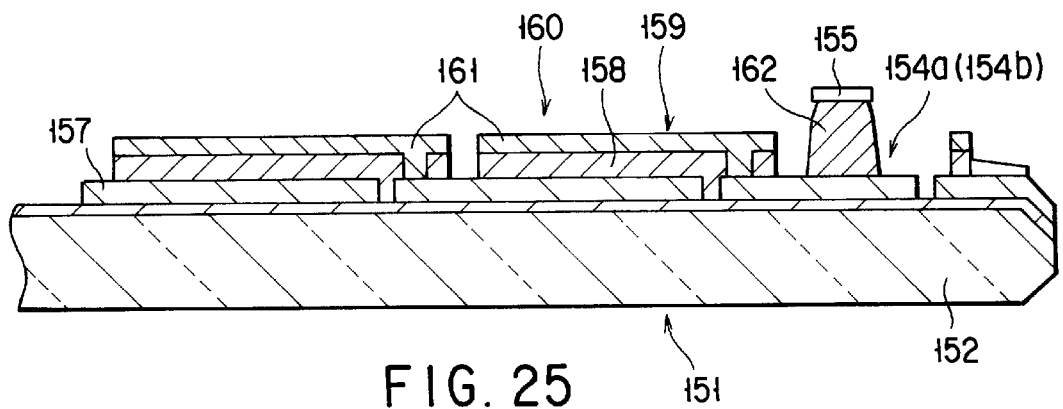
FIG. 25 is a cross-sectional view of a photovoltaic module of the fourth embodiment.

Since the solar battery sub-modules 153a, 153b and 135c have the same structure, one of them will be described. As shown in FIG. 25, each solar battery sub-module has a layered body 160, in which a transparent electrode layer 157, a photovoltaic semiconductor layer 158 and a rear surface electrode layer 159 are laminated in this order on an insulating substrate 152, such as a glass substrate. The layered body 160 is divided into a plurality of photoelectric converting cells 161, which are electrically connected to one another.

A method for producing a photovoltaic module 151 will now be described with reference to FIGS. 24A to 24C. The insulating substrate 152 has a size of, for example, 910 mm×455 mm, and the three solar battery sub-modules 153a, 153b and 135c are formed on the insulating substrate 152. The insulating substrate 152 is transferred to a lead wire connecting step, in which solder bumps 162 as shown in FIG. 25 are formed on the lead wire soldering regions 154a and 154b of each of the solar battery sub-modules 153a, 153b and 135c.

Then, a lead wire 155 is continuously laid across the dividing regions 156a and 156b on a row of solder bumps 162. The lead wire 155 is heated, while it is pressed against a solder bump 162, with the result that it is connected to the solder bump 162.

The solder bumps 162 may be formed on the lead wire soldering regions 154a and 154b either automatically or manually by means of a bump soldering iron. Further, the lead wire 155 may be connected to the solder bump 162 either manually with a lead wire soldering iron or automatically by an automatic soldering apparatus. Alternatively, a lead wire with solder bumps may be used to connect the lead wire 155 to the lead wire soldering region. In this case, the step for forming solder bumps on the lead wire soldering region is omitted.

Thereafter, the lead wire 155 extending across the dividing regions 156a and 156b is cut by a cutter or the like at the dividing regions 156a and 156b. As a result, the lead wire 155 is cut into the portions respectively in the solar battery sub-modules 153a, 153b and 153c.

The lead wire 155 is cut such that a cut end portion thereof may not project from the rear surface electrode layer 159. After the lead wire 155 is cut, a process of insulating a peripheral region, a performance test, or a cleaning process may be performed, if necessary.

Figure 26A:
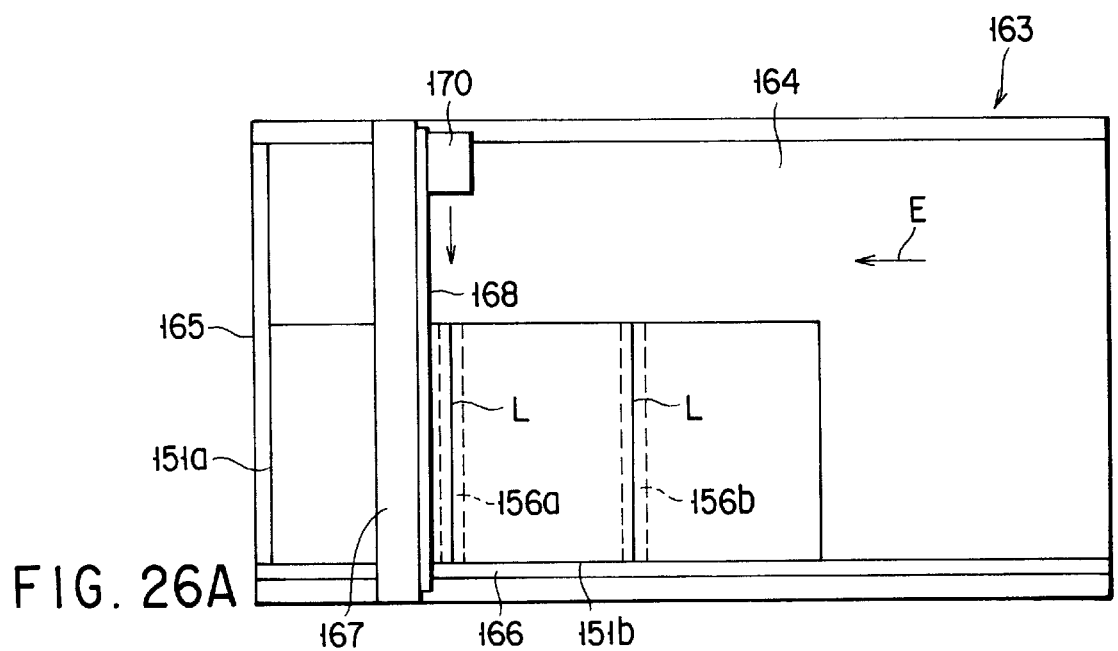
FIG. 26A is a plan view of a glass cutter of the fourth embodiment.
Figure 26B:
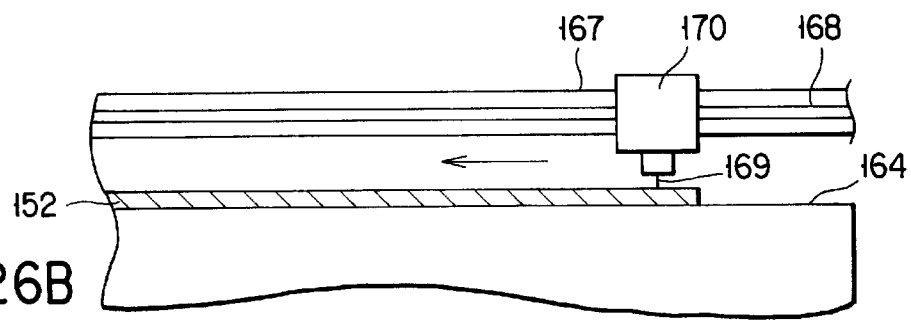
FIG. 26B is a diagram showing the fourth embodiment as viewed from the direction of the arrow E shown in FIG. 26A.

Then, the photovoltaic module 151 is taken out from the lead wire connecting step, and transferred into a substrate dividing step. In the substrate dividing step, as shown in FIGS. 26A and 26B, the insulating substrate 152 is cut at the dividing regions 153a and 153b by a glass cutter 163 into a plurality of solar-battery sub-modules, e.g., the solar battery sub-modules 153a, 153b and 135c.

The glass cutter 163 has a longitudinal reference surface 165 and a lateral reference surface 166 forming the angle of 90° with a mount table 164, on which the photovoltaic module 151 is placed. A frame 167, extending parallel with the longitudinal reference surface 165, is mounted on the mount table 164 so as to be movable in parallel with the lateral reference surface.

The frame 167 has an LM guide 168. A cutter head 170 having a diamond cutter 169 is movably attached to the LM guide 168. The cutter head 170 is moved manually or by a driving mechanism (not shown).

The photovoltaic module 151 to be divided is placed on the mount table 164 with the insulating substrate 152 facing upward. A longitudinal surface 151a and a lateral surface 151b are respectively brought into contact with the longitudinal reference surface 165 and the lateral reference surface 166. As a result, the photovoltaic module 151 is positioned in X and Y directions. Then, the frame 176 is moved in the lateral direction to position the diamond cutter 169 with respect to a parting line L drawn in the dividing region 156b of the photovoltaic module 151. In this state, the cutter head 170 is moved along the LM guide 168 in the direction of the arrow shown in FIGS. 26A and 26B, thereby forming a mark-off line (groove) in the parting line L with the diamond cutter 169.

The frame 167 is moved again in the lateral direction to position the diamond cutter 169 with respect to a parting line L drawn in the dividing region 156a of the photovoltaic module 151. In this state, the cutter head 170 is moved along the LM guide 168 in the direction of the arrow, thereby forming a mark-off line (groove) in the parting line L with the diamond cutter 169.

Then, the photovoltaic module 151 is lifted up from the mount table 164. Thereafter, pressure force or shock is applied to the insulating substrate 152, using the parting lines L as fold fulcrums. As a result, the insulating substrate 152 is cut along the parting lines L, so that three solar battery sub-modules 153a, 153b and 153c can be obtained.

In general, after glass is cut, a cut side of the glass has an acute angle. Therefore, a process for removing the acute angle portion (chamfering) may be required in order to return the side to the original state of the substrate side. It is possible to cut the photovoltaic module 151 after output deriving wires are connected and sealed.

In the fourth embodiment described above, the three solar battery sub-modules 153a, 153b and 153c are formed on the insulating substrate 152. However, the number of sub-modules formed on the insulating substrate 152 is not limited. Further, photovoltaic modules of different sizes may be formed on the insulating substrate 152.

According to the fourth embodiment, even when a photovoltaic module of a small size is produced, formation of a transparent electrode layer, a photovoltaic semiconductor layer and a rear surface electrode layer and laser scribing of a layered body comprising these layers are carried out in the same manner as in the case of producing a standard large-size photovoltaic module. In addition, since the lead wires can be continuously connected to the lead wire soldering regions, the working efficiency can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for automatically soldering a lead wire to a solar battery via a plurality of solder bumps formed in a row at regular pitch in a lead wire soldering region of the solar battery, said method comprising:

a first step for feeding the lead wire from a lead wire feeding section for feeding out the lead wire to lay the lead wire over all length of the row of solder bumps;

a second step after the first step for repeating an operation for holding the lead wire on the solder bump by a soldering unit, an operation for welding the lead wire to the solder bump and an operation for releasing the holding of the lead wire, thereby successively soldering the lead wire from one end to another to the solder bumps; and a third step for cutting the lead wire into a soldered lead wire and an unsoldered lead wire at a position near the lead wire feeding section.

2. A method according to claim 1, wherein two soldering units are arranged along a direction of the row of solder bumps, and operated alternately or simultaneously to solder the lead wire to the solder bumps.

3. A mechanism for automatically soldering a lead wire to a solar battery via a plurality of solder bumps formed in a row at regular pitch in a lead wire soldering region of the solar battery, said mechanism comprising:

a lead wire feeding section for feeding the lead wire;

a lead wire chuck mechanism for chucking an end of the lead wire in the lead wire feeding section to feed out the lead wire and laying the lead wire over all length of the row of solder bumps;

a soldering unit, having a lead holding member for holding the lead wire on the solder bump while the lead wire is laid over all length of the row of solder bumps, and a soldering iron, for repeating an operation for welding the lead wire to the solder bump by means of the soldering iron, while holding the lead wire on the solder bump by means of the lead holding member, thereby successively soldering the lead wire from one end to another to the solder bumps;

a torque control roller for maintaining the tension on the lead wire substantially constant while the lead wire is soldered to the solder bumps and for preventing the lead wire from being wrinkled or cut during soldering; and a cutter mechanism for cutting the lead wire into a soldered lead wire and an unsoldered lead wire at a position near the lead wire feeding section.

4. A mechanism according to claim 3, wherein two soldering units are arranged along a direction of the row of solder bumps, and operated alternately or simultaneously to solder the lead wire to the solder bumps.

5. A mechanism according to claim 4, wherein each of the two soldering units comprises a soldering iron, and a distance between the soldering irons coincides with the pitch of the solder bumps.

6. A mechanism according to claim 3, wherein a plurality of lead wire feeding sections and a plurality of solder units are provided in accordance with lead wire soldering regions of the solar battery, and operated simultaneously.

7. A mechanism according to claim 3, wherein the lead wire feeding section has a bobbin around which the lead wire is wound.

8. A mechanism according to claim 3, wherein the soldering unit is supported by a movable base movable along a guide rail and stepwisely moved along the lead wire soldering region of the solar battery.

9. A mechanism according to claim 3, wherein the soldering unit has a lead holding member for holding the lead wire on a solder bump and a soldering iron for soldering the lead wire to the solder bump.

10. A mechanism according to claim 3, wherein the lead wire chuck mechanism is movable to and removable from the lead wire soldering region, and chucks the end of the lead wire in the lead wire feeding section when it moves to the lead wire soldering region.

11. A mechanism according to claim 3, wherein the cutter mechanism is movable to and removable from the lead wire soldering region, and cuts the lead wire into the soldered lead wire and the unsoldered lead wire.

12. A mechanism for automatically soldering a lead wire to a solar battery having a lead wire soldering region, said mechanism comprising:

a preparatory soldering apparatus, having a bump soldering iron movable perpendicular to the lead wire soldering region, for forming a row of solder bumps arranged at regular pitch in the lead wire soldering region; and a lead wire soldering apparatus for supplying the lead wire onto the row of solder bumps on the solar battery, the lead wire soldering apparatus including:

a soldering iron, having opposing sides, for welding the lead wire to the solder bumps;

a lead holding member positioned adjacent the soldering iron; and a lead holding pin positioned adjacent the soldering iron on the side of the soldering iron opposite the lead holder member;

wherein the lead holding member, the soldering iron, and the lead holding pin sequentially contact the lead wire with the lead holding member contacting the lead wire first, the soldering iron contacting the lead wire second, and the lead holding pin contacting the lead wire last while the soldering iron welds the lead wire to the solder bumps.

13. A mechanism according to claim 12, wherein the lead wire holding member includes a holding portion, a longitudinal direction thereof corresponds to a length direction of the lead wire, for holding the lead wire from above in cooperation with up and down movement of the lead wire soldering iron.

14. A mechanism according to claim 12, wherein ultrasonic vibration is applied to the lead wire soldering iron, when a solder bump of a lead wire with solder bumps is connected to the lead wire soldering region.

* * * * *